US009047836B2

(12) United States Patent
Koyama

(10) Patent No.: US 9,047,836 B2
(45) Date of Patent: Jun. 2, 2015

(54) DISPLAY DEVICE AND ELECTRONIC DEVICE

(75) Inventor: Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1080 days.

(21) Appl. No.: 12/972,737

(22) Filed: Dec. 20, 2010

(65) Prior Publication Data

US 2011/0157128 A1 Jun. 30, 2011

(30) Foreign Application Priority Data

Dec. 24, 2009 (JP) ................................. 2009-292630

(51) Int. Cl.

| | |
|---|---|
| ***G09G 5/00*** | (2006.01) |
| ***H01L 29/10*** | (2006.01) |
| ***G09G 3/36*** | (2006.01) |
| *G09G 3/20* | (2006.01) |

(52) U.S. Cl.

CPC ............ *G09G 3/3648* (2013.01); *G09G 3/2025* (2013.01); *G09G 3/2081* (2013.01); *G09G 2320/0214* (2013.01)

(58) Field of Classification Search

CPC ..... G09G 3/36; G09G 3/3696; G09G 3/2081; G09G 3/2077

USPC .................................... 345/76, 204, 211, 690

See application file for complete search history.

(56) References Cited

U.S. PATENT DOCUMENTS

| | | | |
|---|---|---|---|
| 3,675,232 | A | 7/1972 | Strout |
| 5,122,784 | A | 6/1992 | Canova |
| 5,122,792 | A | 6/1992 | Stewart |
| 5,272,471 | A | 12/1993 | Asada et al. |
| 5,724,058 | A | 3/1998 | Choi et al. |
| 5,731,856 | A | 3/1998 | Kim et al. |

(Continued)

FOREIGN PATENT DOCUMENTS

| | | |
|---|---|---|
| EP | 1031961 A | 8/2000 |
| EP | 1225557 | 7/2002 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Alexander Eisen
*Assistant Examiner* — Amit Chatly
(74) *Attorney, Agent, or Firm* — Eric J. Robinson; Robinson Intellectual Property Law Office, P.C.

(57) ABSTRACT

Multiple gray levels are expressed in a display device. The display device includes a pixel portion where pixels including transistors and display elements are arranged in matrix, a gate driver electrically connected to a gate of the transistor, a source driver electrically connected to a source or a drain of the transistor, and a data processing circuit which outputs a signal to the source driver. The transistor includes an oxide semiconductor. In the data processing circuit, n-bit digital data of input m-bit digital data (m and n are positive integers, where m>n) is used for voltage gradation and (m−n) bit digital data is used for time gradation.

33 Claims, 15 Drawing Sheets

(56) References Cited

U.S. PATENT DOCUMENTS

| | | | | |
|---|---|---|---|---|
| 5,744,864 | A | 4/1998 | Cillessen et al. | |
| 5,892,496 | A | 4/1999 | Wakeland | |
| 5,903,249 | A | 5/1999 | Koyama et al. | |
| 6,184,874 | B1 | 2/2001 | Smith et al. | |
| 6,292,168 | B1 | 9/2001 | Venable et al. | |
| 6,294,274 | B1 | 9/2001 | Kawazoe et al. | |
| 6,563,174 | B2 | 5/2003 | Kawasaki et al. | |
| 6,727,522 | B1 | 4/2004 | Kawasaki et al. | |
| 6,753,854 | B1 * | 6/2004 | Koyama et al. | 345/204 |
| 6,952,194 | B1 | 10/2005 | Yamazaki et al. | |
| 7,049,190 | B2 | 5/2006 | Takeda et al. | |
| 7,061,014 | B2 | 6/2006 | Hosono et al. | |
| 7,064,346 | B2 | 6/2006 | Kawasaki et al. | |
| 7,105,868 | B2 | 9/2006 | Nause et al. | |
| 7,145,536 | B1 | 12/2006 | Yamazaki et al. | |
| 7,193,594 | B1 | 3/2007 | Yamazaki et al. | |
| 7,211,825 | B2 | 5/2007 | Shih et al | |
| 7,227,519 | B1 | 6/2007 | Kawase et al. | |
| 7,233,342 | B1 | 6/2007 | Yamazaki et al. | |
| 7,282,782 | B2 | 10/2007 | Hoffman et al. | |
| 7,297,977 | B2 | 11/2007 | Hoffman et al. | |
| 7,323,356 | B2 | 1/2008 | Hosono et al. | |
| 7,385,224 | B2 | 6/2008 | Ishii et al. | |
| 7,402,506 | B2 | 7/2008 | Levy et al. | |
| 7,411,209 | B2 | 8/2008 | Endo et al. | |
| 7,453,065 | B2 | 11/2008 | Saito et al. | |
| 7,453,087 | B2 | 11/2008 | Iwasaki | |
| 7,462,862 | B2 | 12/2008 | Hoffman et al. | |
| 7,468,304 | B2 | 12/2008 | Kaji et al. | |
| 7,501,293 | B2 | 3/2009 | Ito et al. | |
| 7,635,889 | B2 | 12/2009 | Isa et al. | |
| 7,674,650 | B2 | 3/2010 | Akimoto et al. | |
| 7,732,819 | B2 | 6/2010 | Akimoto et al. | |
| 7,807,515 | B2 | 10/2010 | Kato et al. | |
| 7,868,326 | B2 | 1/2011 | Sano et al. | |
| 7,998,372 | B2 | 8/2011 | Yano et al. | |
| 8,168,974 | B2 | 5/2012 | Sano et al. | |
| 8,242,837 | B2 | 8/2012 | Yamazaki et al. | |
| 8,324,018 | B2 | 12/2012 | Isa et al. | |
| 8,350,621 | B2 | 1/2013 | Yamazaki et al. | |
| 8,384,077 | B2 | 2/2013 | Yano et al. | |
| 2001/0046027 | A1 | 11/2001 | Tai et al. | |
| 2002/0056838 | A1 | 5/2002 | Ogawa | |
| 2002/0132454 | A1 | 9/2002 | Ohtsu et al. | |
| 2003/0048247 | A1 * | 3/2003 | Ham | 345/87 |
| 2003/0189401 | A1 | 10/2003 | Kido et al. | |
| 2003/0218222 | A1 | 11/2003 | Wager et al. | |
| 2004/0038446 | A1 | 2/2004 | Takeda et al. | |
| 2004/0127038 | A1 | 7/2004 | Carcia et al. | |
| 2005/0017302 | A1 | 1/2005 | Hoffman | |
| 2005/0199959 | A1 | 9/2005 | Chiang et al. | |
| 2006/0035452 | A1 | 2/2006 | Carcia et al. | |
| 2006/0043377 | A1 | 3/2006 | Hoffman et al. | |
| 2006/0091793 | A1 | 5/2006 | Baude et al. | |
| 2006/0108529 | A1 | 5/2006 | Saito et al. | |
| 2006/0108636 | A1 | 5/2006 | Sano et al. | |
| 2006/0110867 | A1 | 5/2006 | Yabuta et al. | |
| 2006/0113536 | A1 | 6/2006 | Kumomi et al. | |
| 2006/0113539 | A1 | 6/2006 | Sano et al. | |
| 2006/0113549 | A1 | 6/2006 | Den et al. | |
| 2006/0113565 | A1 | 6/2006 | Abe et al. | |
| 2006/0169973 | A1 | 8/2006 | Isa et al. | |
| 2006/0170111 | A1 | 8/2006 | Isa et al. | |
| 2006/0197092 | A1 | 9/2006 | Hoffman et al. | |
| 2006/0208977 | A1 | 9/2006 | Kimura | |
| 2006/0228974 | A1 | 10/2006 | Thelss et al. | |
| 2006/0231882 | A1 | 10/2006 | Kim et al. | |
| 2006/0238135 | A1 | 10/2006 | Kimura | |
| 2006/0244107 | A1 | 11/2006 | Sugihara et al. | |
| 2006/0284171 | A1 | 12/2006 | Levy et al. | |
| 2006/0284172 | A1 | 12/2006 | Ishii | |
| 2006/0292777 | A1 | 12/2006 | Dunbar | |
| 2007/0024187 | A1 | 2/2007 | Shin et al. | |
| 2007/0046191 | A1 | 3/2007 | Saito | |
| 2007/0052025 | A1 | 3/2007 | Yabuta | |
| 2007/0054507 | A1 | 3/2007 | Kaji et al. | |
| 2007/0090365 | A1 | 4/2007 | Hayashi et al. | |
| 2007/0108446 | A1 | 5/2007 | Akimoto | |
| 2007/0152217 | A1 | 7/2007 | Lai et al. | |
| 2007/0172591 | A1 | 7/2007 | Seo et al. | |
| 2007/0187678 | A1 * | 8/2007 | Hirao et al. | 257/43 |
| 2007/0187760 | A1 | 8/2007 | Furuta et al. | |
| 2007/0194379 | A1 | 8/2007 | Hosono et al. | |
| 2007/0252928 | A1 | 11/2007 | Ito et al. | |
| 2007/0272922 | A1 | 11/2007 | Kim et al. | |
| 2007/0287296 | A1 | 12/2007 | Chang | |
| 2008/0006877 | A1 | 1/2008 | Mardilovich et al. | |
| 2008/0017854 | A1 * | 1/2008 | Marks et al. | 257/43 |
| 2008/0038882 | A1 | 2/2008 | Takechi et al. | |
| 2008/0038929 | A1 | 2/2008 | Chang | |
| 2008/0050595 | A1 | 2/2008 | Nakagawara et al. | |
| 2008/0073653 | A1 | 3/2008 | Iwasaki | |
| 2008/0083950 | A1 | 4/2008 | Pan et al. | |
| 2008/0106191 | A1 | 5/2008 | Kawase | |
| 2008/0128689 | A1 | 6/2008 | Lee et al. | |
| 2008/0129195 | A1 | 6/2008 | Ishizaki et al. | |
| 2008/0166834 | A1 | 7/2008 | Kim et al. | |
| 2008/0182358 | A1 | 7/2008 | Cowdery-Corvan et al. | |
| 2008/0224133 | A1 | 9/2008 | Park et al. | |
| 2008/0254569 | A1 | 10/2008 | Hoffman et al. | |
| 2008/0258139 | A1 | 10/2008 | Ito et al. | |
| 2008/0258140 | A1 | 10/2008 | Lee et al. | |
| 2008/0258141 | A1 | 10/2008 | Park et al. | |
| 2008/0258143 | A1 | 10/2008 | Kim et al. | |
| 2008/0296568 | A1 | 12/2008 | Ryu et al. | |
| 2009/0021536 | A1 | 1/2009 | Abe et al. | |
| 2009/0045397 | A1 * | 2/2009 | Iwasaki | 257/43 |
| 2009/0068773 | A1 | 3/2009 | Lai et al. | |
| 2009/0073325 | A1 | 3/2009 | Kuwabara et al. | |
| 2009/0114910 | A1 | 5/2009 | Chang | |
| 2009/0134399 | A1 | 5/2009 | Sakakura et al. | |
| 2009/0152506 | A1 | 6/2009 | Umeda et al. | |
| 2009/0152541 | A1 | 6/2009 | Maekawa et al. | |
| 2009/0278122 | A1 | 11/2009 | Hosono et al. | |
| 2009/0280600 | A1 | 11/2009 | Hosono et al. | |
| 2010/0065844 | A1 | 3/2010 | Tokunaga | |
| 2010/0073268 | A1 * | 3/2010 | Matsunaga et al. | 345/76 |
| 2010/0092800 | A1 | 4/2010 | Itagaki et al. | |
| 2010/0109002 | A1 | 5/2010 | Itagaki et al. | |
| 2010/0159639 | A1 | 6/2010 | Sakata | |
| 2010/0193782 | A1 | 8/2010 | Sakata | |
| 2010/0219410 | A1 | 9/2010 | Godo et al. | |
| 2010/0304529 | A1 | 12/2010 | Sasaki et al. | |
| 2013/0122963 | A1 | 5/2013 | Yamazaki et al. | |

FOREIGN PATENT DOCUMENTS

| | | | |
|---|---|---|---|
| EP | 1737044 | A | 12/2006 |
| EP | 2020686 | A | 2/2009 |
| EP | 2226847 | A | 9/2010 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-110530 | | 4/1996 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2000-310980 | A | 11/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-173580 | A | 6/2006 |
| JP | 2006-237586 | A | 9/2006 |
| JP | 2007-073558 | A | 3/2007 |

(56) References Cited

FOREIGN PATENT DOCUMENTS

| | | | |
|---|---|---|---|
| JP | 2007-109918 | A | 4/2007 |
| JP | 2007-142195 | A | 6/2007 |
| JP | 2009-224479 | A | 10/2009 |
| WO | WO-2004/114391 | | 12/2004 |
| WO | WO-2006/051995 | | 5/2006 |
| WO | WO-2007/105778 | | 9/2007 |
| WO | WO-2007/139009 | | 12/2007 |
| WO | WO-2009/096608 | | 8/2009 |
| WO | WO-2009/139482 | | 11/2009 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn—Doped Zinc Indium Oxide Thin Film Transistors for AMOLED Backplane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

(56) References Cited

OTHER PUBLICATIONS

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using Castep,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.
Park et al., "High performance amorphous oxide thin film transistors with self-aligned top-gate structure," IEDM 09: Technical Digest of International Electron Devices Meeting, Dec. 7, 2009, pp. 191-194.
International Search Report (Application No. PCT/JP2010/071624) Dated Dec. 28, 2010.
Written Opinion (Application No. PCT/JP2010/071624) Dated Dec. 28, 2010.

* cited by examiner

FIG. 4

| 201 | 202 | 203 | 231 | 232 | 233 | 234 | 240 |
|---|---|---|---|---|---|---|---|
| 0000 | 00 | 01 | 00 | 00 | 00 | 00 | $V_L$ |
| 0001 | 00 | 01 | 00 | 00 | 00 | 01 | $V_L+\alpha/4$ |
| 0010 | 00 | 01 | 00 | 00 | 01 | 01 | $V_L+2\alpha/4$ |
| 0011 | 00 | 01 | 00 | 01 | 01 | 01 | $V_L+3\alpha/4$ |
| 0100 | 01 | 10 | 01 | 01 | 01 | 01 | $V_L+\alpha$ |
| 0101 | 01 | 10 | 01 | 01 | 01 | 10 | $V_L+5\alpha/4$ |
| 0110 | 01 | 10 | 01 | 01 | 10 | 10 | $V_L+6\alpha/4$ |
| 0111 | 01 | 10 | 01 | 10 | 10 | 10 | $V_L+7\alpha/4$ |
| 1000 | 10 | 11 | 10 | 10 | 10 | 10 | $V_L+2\alpha$ |
| 1001 | 10 | 11 | 10 | 10 | 10 | 11 | $V_L+9\alpha/4$ |
| 1010 | 10 | 11 | 10 | 10 | 11 | 11 | $V_L+10\alpha/4$ |
| 1011 | 10 | 11 | 10 | 11 | 11 | 11 | $V_L+11\alpha/4$ |
| 1100 | 11 | 11 | 11 | 11 | 11 | 11 | $V_L+3\alpha$ |
| 1101 | 11 | 11 | 11 | 11 | 11 | 11 | $V_L+3\alpha$ |
| 1110 | 11 | 11 | 11 | 11 | 11 | 11 | $V_L+3\alpha$ |
| 1110 | 11 | 11 | 11 | 11 | 11 | 11 | $V_L+3\alpha$ |

FIG. 13

| 201 | 202 | 203 | 231 | 232 | 233 | 234 | 240 |
|---|---|---|---|---|---|---|---|
| 0000 | 00 | 01 | 00 | 00 | 00 | 00 | $V_L$ |
| 0001 | 00 | 01 | 00 | 00 | 00 | 01 | $V_L+\alpha/4$ |
| 0010 | 00 | 01 | 00 | 00 | 01 | 01 | $V_L+2\alpha/4$ |
| 0011 | 00 | 01 | 00 | 01 | 01 | 01 | $V_L+3\alpha/4$ |
| 0100 | 01 | 10 | 01 | 01 | 01 | 01 | $V_L+\alpha$ |
| 0101 | 01 | 10 | 01 | 01 | 01 | 10 | $V_L+5\alpha/4$ |
| 0110 | 01 | 10 | 01 | 01 | 10 | 10 | $V_L+6\alpha/4$ |
| 0111 | 01 | 10 | 01 | 10 | 10 | 10 | $V_L+7\alpha/4$ |
| 1000 | 10 | 11 | 10 | 10 | 10 | 10 | $V_L+2\alpha$ |
| 1001 | 10 | 11 | 10 | 10 | 10 | 11 | $V_L+9\alpha/4$ |
| 1010 | 10 | 11 | 10 | 10 | 11 | 11 | $V_L+10\alpha/4$ |
| 1011 | 10 | 11 | 10 | 11 | 11 | 11 | $V_L+11\alpha/4$ |
| 1100 | 11 | 11 | 11 | 11 | 11 | 11 | $V_L+3\alpha$ |
| 1101 | 11 | 11 | 11 | 11 | 11 | $V_H$ | $V_L+13\alpha/4$ |
| 1110 | 11 | 11 | 11 | 11 | $V_H$ | $V_H$ | $V_L+14\alpha/4$ |
| 1110 | 11 | 11 | 11 | $V_H$ | $V_H$ | $V_H$ | $V_L+15\alpha/4$ |

DISPLAY DEVICE AND ELECTRONIC DEVICE

TECHNICAL FIELD

The technical field of the present invention rerates to a display device and a driving method thereof. In particular, the technical field of the present invention relates to a display device capable of expressing multiple gray levels. Further, the technical field of the present invention rerates to an electronic device including the display device.

BACKGROUND ART

Display devices in which driving is performed using transistors including amorphous silicon or polysilicon are mainly used. However, it is difficult for these display devices to express multiple gray levels due to the influence of the off-state current of the transistors.

As an example of a pixel in a display device, FIG. 15 illustrates a pixel 5000 which includes a transistor 5001, a liquid crystal element 5002, and a capacitor 5003. The transistor 5001 includes amorphous silicon or polysilicon. In the pixel 5000, when image data is written to the liquid crystal element 5002 and the capacitor 5003 through the transistor 5001, an electric field is applied to the liquid crystal element 5002, so that images can be displayed.

However, due to the off-state current of the transistor 5001, electrical charges accumulated in the liquid crystal element 5002 and the capacitor 5003 are discharged, so that the voltage of the pixel fluctuates.

In the pixel 5000, the off-state current i of the transistor 5001, the storage capacitance C of the capacitor 5003, the fluctuation V in voltage, and the hold time T satisfy the relation of CV=iT. Therefore, if the off-state current i of the transistor 5001 is 0.1 pA (p indicates $10^{-12}$), the capacitance C of the capacitor 5003 is 0.1 pF, and one frame period is 16.6 ms, the fluctuation Vin voltage in the pixel in one frame period can be calculated as follows: 0.1 [pF]×V=0.1 [pA]×16.6 [ms]; thus, V=16.6 [mV].

If the display device has 256 (=$2^8$) gray levels and the highest drive voltage of the liquid crystal element in the pixel of 5 V, gray level voltage per gray level is about 20 mV. In other words, the fluctuation V (16.6 mV) in voltage in the pixel that is obtained from the calculation corresponds to the fluctuation in gray level voltage for about one gray level.

If the display device has 1024 (=$2^{10}$) gray levels, gray level voltage per gray level is about 5 mV. Therefore, the fluctuation V (16.6 mV) in voltage in the pixel corresponds to the fluctuation in gray level voltage for about four gray levels, and the influence of fluctuation in voltage due to off-state current cannot be ignored.

In Reference 1, a display device including a polysilicon transistor has been suggested.

REFERENCE

[Reference 1] Japanese Published Patent Application No. H8-110530

DISCLOSURE OF INVENTION

In a conventional display device, voltage in a pixel greatly fluctuates due to the off-state current of a transistor; thus, it is difficult to express multiple gray levels.

In view of the problem, it is an object of one embodiment of the present invention to express multiple gray levels by a reduction in fluctuation in voltage in a pixel.

It is an object of one embodiment of the present invention to express multiple gray levels without complication of a circuit for driving a pixel.

One embodiment of the present invention is a display device where a transistor including an oxide semiconductor is provided in a pixel as a switch element. The oxide semiconductor is intrinsic or substantially intrinsic. Off-state current per unit channel width of the transistor is 100 aA/μm or less (a indicates $10^{-18}$), preferably 1 aA/μm or less, more preferably 1 zA/μm or less (z indicates $10^{-21}$). Note that in this specification, the term “intrinsic” indicates the state of a semiconductor whose carrier concentration is lower than $1\times10^{12}/cm^3$, and the term “substantially intrinsic” indicates the state of a semiconductor whose carrier concentration is higher than or equal to $1\times10^{12}/cm^3$ and lower than $1\times10^{14}/cm^3$.

In other words, in one embodiment of the present invention, in consideration of the relation of CV=iT, the off-state current i is reduced in order to reduce the fluctuation V in voltage in the pixel.

One embodiment of the present invention is a display device which expresses gray levels. In the display device, n-bit digital data of input m-bit digital data is used for voltage gradation and (m−n)-bit digital data is used for time gradation. That is, m-bit gray levels can be expressed by a source driver which processes n bits. Note that m and n are positive integers, where m>n.

In one embodiment of the present invention, multiple gray levels can be expressed by a reduction in fluctuation in voltage in a pixel by a reduction in off-state current of a transistor.

Further, in one embodiment of the present invention, when a combination of voltage gradation and time gradation is used as a method for processing data, multiple gray levels can be expressed without complication of a source driver.

BRIEF DESCRIPTION OF DRAWINGS

In the accompanying drawings:

FIG. 4 illustrates an example of data processing;

FIG. 13 illustrates an example of data processing;

BEST MODE FOR CARRYING OUT THE INVENTION

Figure 1:
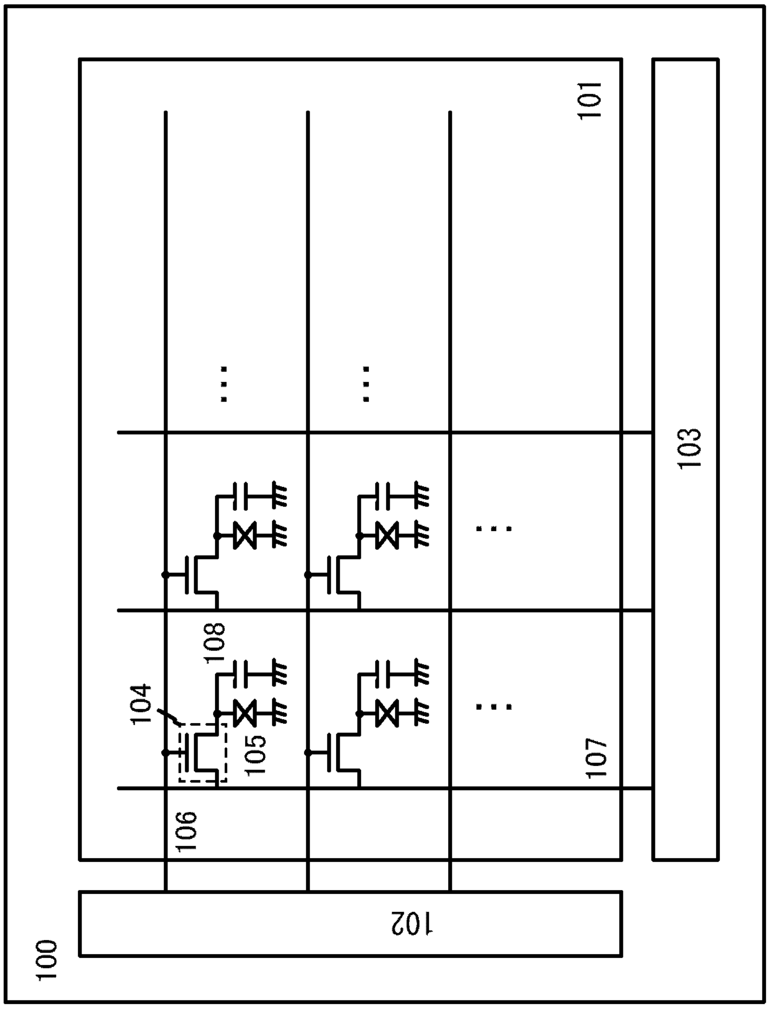
FIG. 1 illustrates an example of a display device.

Embodiments of the disclosed invention will be described below with reference to the drawings. Note that the present invention is not limited to the following description. It will be readily appreciated by those skilled in the art that modes and details of the present invention can be changed in various ways without departing from the spirit and scope of the present invention. Therefore, the present invention should not be construed as being limited to the following description of the embodiments.

EMBODIMENT 1

First, the structure of a display device in this embodiment is described with reference to FIG. 1. The display device includes a display portion 100. Here, a display element is a liquid crystal element.

The display portion 100 includes a pixel portion 101, a gate driver 102, and a source driver 103. In the pixel portion 101, pixels including transistors 104, liquid crystal elements 105, and capacitors 108 are arranged in matrix. Note that the gate driver 102 and the source driver 103 may be formed over the same substrate as the pixel portion 101 or may be formed over different substrates.

A gate of the transistor 104 is electrically connected to the gate driver 102 through a wiring 106 (also referred to as a gate line). One of a source and a drain of the transistor 104 is electrically connected to the source driver 103 through a wiring 107 (also referred to as a source line). The other is electrically connected to the liquid crystal element 105 and the capacitor 108.

The transistor 104 functions as a switch element for bringing the liquid crystal element 105 and the wiring 107 into conduction. Further, the capacitor 108 has a function of holding voltage applied to the liquid crystal element 105 for a certain period of time.

In each pixel, the off-state current i of the transistor 104, the storage capacitance C of the capacitor 108, the fluctuation V in voltage, and the hold time T satisfy the relation of CV=iT. Thus, when the off-state current i of the transistor 104 is reduced, the fluctuation V in voltage when the transistor 104 is off can be reduced.

In this embodiment, the transistor 104 includes an oxide semiconductor. In particular, with the use of an intrinsic or substantially intrinsic oxide semiconductor, off-state current per unit channel width (W) of the transistor 104 at room temperature can be 100 aA/μm or less, preferably 1 aA/μm or less, more preferably 10 zA/μm or less.

For example, if the off-state current of the transistor 104 is 1 aA, the capacitance of the capacitor 108 is 0.1 pF, and one frame period is 16.6 ms, the fluctuation V in voltage in the pixel due to the off-state current of the transistor 104 can be calculated from the relation as follows: 0.1 [pF]×V=1 [aA]×16.6 [ms]; thus, $V=16.6\times10^{-5}$ [mV].

Here, if the display device has 256 gray levels and the highest drive voltage of the liquid crystal element in the pixel of 5 V, gray level voltage per gray level is about 20 mV. In other words, the fluctuation V ($16.6\times10^{-5}$ mV) in voltage in the pixel that is obtained here is much lower than 20 mV (the gray level voltage per gray level). Even in the case where a higher gray level is expressed, the fluctuation in voltage does not affect display.

That is, the fluctuation in voltage in the pixel due to the off-state current of the transistor 104 can be regarded as substantially zero.

Note that since the fluctuation in voltage in the pixel due to the off-state current of the transistor 104 is substantially zero, the fluctuation in voltage in the pixel due to the leakage current of the liquid crystal element 105 is considered. The leakage current of a general liquid crystal element is about 1 fA (f indicates $10^{-15}$); thus, the fluctuation V in voltage is 0.166 mV when calculation is performed in a similar manner. Theoretically, when the display device has about 30000 gray levels, the fluctuation in voltage affects display; however, gray levels can be expressed without problems taking human's visual capability into consideration. Therefore, in a normal liquid crystal element, leakage current thereof does not matter.

When a transistor having a channel formation region including an intrinsic or substantially intrinsic oxide semiconductor is provided in a pixel as described above, the fluctuation in voltage in the pixel due to the off-state current of the transistor can be suppressed, so that gray level characteristics of the pixel can be improved.

Next, the characteristics of a transistor including an oxide semiconductor in this embodiment are described in detail.

The oxide semiconductor used for the transistor in this embodiment is preferably a semiconductor in which impurities that adversely affect the electrical characteristics of the transistor including an oxide semiconductor are reduced to a very low level, that is, the oxide semiconductor is preferably a high-purity semiconductor. As a typical example of an impurity which adversely affects the electrical characteristics, there is hydrogen. Hydrogen is an impurity which might be a carrier donor in an oxide semiconductor. When the oxide semiconductor includes a large amount of hydrogen, the oxide semiconductor might have n-type conductivity. The on/off ratio of a transistor including an oxide semiconductor having n-type conductivity cannot be high enough. Therefore, in this specification, a "high-purity oxide semiconductor" is an intrinsic or substantially intrinsic oxide semiconductor in which hydrogen is reduced as much as possible. As an example of a high-purity oxide semiconductor, there is an oxide semiconductor whose carrier concentration is lower than $1\times10^{14}/cm^3$, preferably lower than $1\times10^{12}/cm^3$, more preferably lower than $1\times10^{11}/cm^3$ or lower than $6.0\times10^{10}/cm^3$. A transistor including a high-purity oxide semiconductor has much lower off-state current than a transistor including a semiconductor containing silicon, for example. Further, in this embodiment, a transistor including a high-purity oxide semiconductor is described below as an n-channel transistor.

In this manner, when a high-purity oxide semiconductor which is obtained by drastic removal of hydrogen contained in an oxide semiconductor is used for a channel formation region of a transistor, a transistor with significantly low off-state current can be provided. An evaluation element (also referred to as TEG) is formed, and the measurement results of off-state current are described below.

Figure 14:
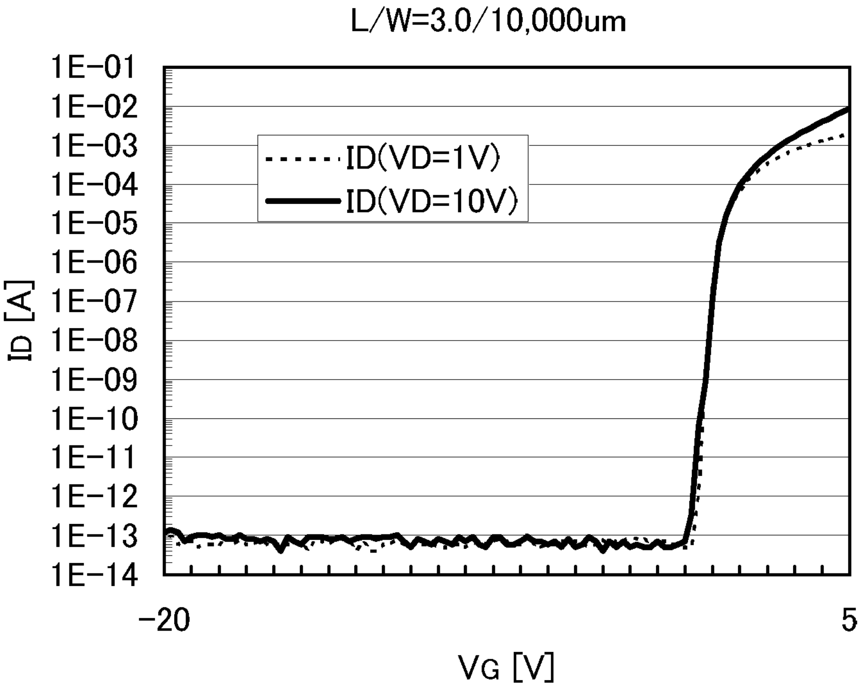
FIG. 14 illustrates electrical characteristics of a transistor.
Figure 15:
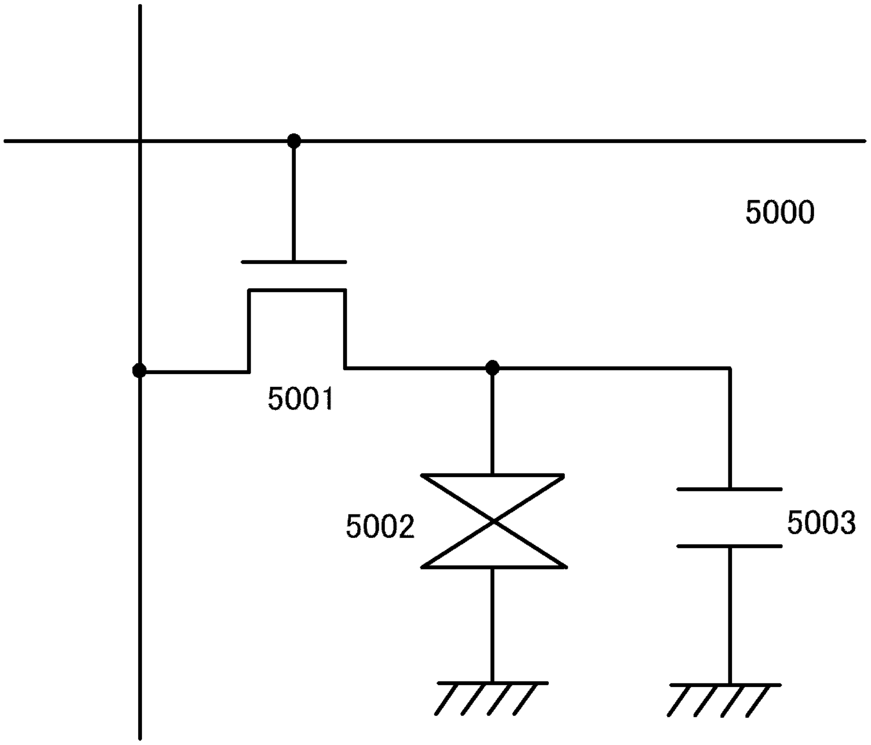
FIG. 15 illustrates an example of a display device.

In the TEG, a thin film transistor with L/W=3 μm/10000 μm in which two hundred transistors with L/W=3 μm/50 μm (thickness d: 30 nm) each are connected in parallel is provided. FIG. 14 illustrates the initial characteristics of the transistor. In order to measure the initial characteristics of the transistor, a change in characteristics of source-drain current (hereinafter referred to as drain current or $I_D$) when source-gate voltage (referred to as gate voltage or $V_G$) is changed, i.e., $V_G$–$I_D$ characteristics were measured under the condition that the substrate temperature was at room temperature, source-drain voltage (hereinafter referred to as drain voltage or $V_D$) was 10 V, and $V_G$ was changed from −20 to +20 V. Here, the measurement results of the $V_G$–$I_D$ characteristics are shown by the range of from −20 to +5 V.

As illustrated in FIG. 14, the transistor having a channel width W of 10000 μm has an off-state current of $1\times10^{-13}$ A or less at $V_D$ of 1 V and 10 V, which is less than or equal to the resolution (100 fA) of a measurement device (a semiconductor parameter analyzer, Agilent 4156C manufactured by Agilent Technologies Inc.). The off-state current per micrometer of the channel width corresponds to 10 aA/μm.

Note that in this specification, off-state current (also referred to as leakage current) is current flowing between a source and a drain of an n-channel transistor when given gate voltage which is in the range of from −20 to −5 V is applied at room temperature in the case where the level of the threshold voltage $V_{th}$ of the n-channel transistor is positive. Note that the room temperature is 15 to 25° C. A transistor including an oxide semiconductor that is disclosed in this specification has a current per unit channel width (W) of 100 aA/μm or less, preferably 1 aA/μm or less, more preferably 10 zA/μm or less at room temperature.

Note that if the amount of the off-state current and the level of the drain voltage are known, resistance when the transistor is off (off resistance R) can be calculated using Ohm's law. If a cross-section area A of the channel formation region and the channel length L are known, off-state resistivity p can be calculated from the formula p=RAIL (R indicates off resistance). The off-state resistivity calculated from FIG. 14 was $1\times10^{9}$ Ω·m or higher (or $1\times10^{10}$ Ω·m or higher). Here, the cross-section area A can be calculated from the formula A=dW (d is the thickness of the channel formation region and W is the channel width). Note that in general, the boundary between a semiconductor and an insulator according to resistivity is about $1\times10^{5}$ Ω·m. In other words, the transistor including an intrinsic or substantially intrinsic oxide semiconductor of one embodiment of the present invention has resistivity which is substantially equal to that of an insulator when the transistor is off. Thus, the transistor has unusual effects as a switch element.

In addition, the energy gap of the oxide semiconductor is 2 eV or more, preferably 2.5 eV or more, more preferably 3 eV or more.

Further, the temperature characteristics of the transistor including a high-purity oxide semiconductor are favorable. Typically, in the temperature range of from −25 to 150° C., the current-voltage characteristics of the transistor, such as on-state current, off-state current, field-effect mobility, a subthreshold value (an S value), and threshold voltage, hardly change and deteriorate due to temperature.

Next, hot-carrier degradation of a transistor including an oxide semiconductor is described.

The hot-carrier degradation is degradation of transistor characteristics, e.g., the fluctuation in threshold voltage or generation of gate leakage due to a phenomenon that electrons which are accelerated to high speed become fixed charges by being injected into a gate insulating film from a channel in the vicinity of a drain, or a phenomenon that electrons which are accelerated to high speed form a trap level at an interface of a gate insulating film. The factors of the hot-carrier degradation are channel-hot-electron injection (CHE injection) and drain-avalanche-hot-carrier injection (DAHC injection).

Since the band gap of silicon is as small as 1.12 eV, electrons are easily generated like an avalanche due to an avalanche breakdown, and the number of electrons which are accelerated to high speed so as to go over a barrier to the gate insulating film is increased. In contrast, the oxide semiconductor described in this embodiment has a large band gap of 3.15 eV; thus, the avalanche breakdown does not easily occur and resistance to hot-carrier degradation is higher than that of silicon.

Note that although the band gap of silicon carbide, which is one of materials having high withstand voltage, and the band gap of an oxide semiconductor are substantially equal to each other, electrons are less likely to be accelerated in the oxide semiconductor because the mobility of the oxide semiconductor is lower than that of silicon carbide by approximately two orders of magnitude. Further, a barrier between the oxide semiconductor and silicon oxide is higher than a barrier between one of silicon carbide, gallium nitride, and silicon and silicon oxide when a material including indium (In) or zinc (Zn) is used for the oxide semiconductor and silcon oxide is used for the gate insulating film; thus, the number of electrons injected into the oxide film is extremely small. Thus, hot-carrier degradation is less likely to occur as compared to silicon carbide, gallium nitride, or silicon, and it can be said that drain withstand voltage is high. Therefore, it is not necessary to intentionally form low-concentration impurity regions between an oxide semiconductor functioning as a channel and a source and drain electrodes, so that the structure of the transistor can be significantly simplified and the number of manufacturing steps can be reduced.

As described above, a transistor including an oxide semiconductor has high drain withstand voltage. Specifically, such a transistor can have a drain withstand voltage of 100 V or higher, preferably 500 V or higher, more preferably 1 kV or higher.

This embodiment can be combined with any of the other embodiments as appropriate.

EMBODIMENT 2

In this embodiment, an example of a structure for expressing multiple gray levels is described.

The capability of expressing multiple gray levels greatly depends on the capability of converting digital data into analog data (gray level voltage) in a source driver.

In general, in the case of a source driver which processes 2-bit digital data, $2^{2}$=4 gray levels can be expressed. In the case of a source driver which processes 8-bit digital data, $2^{8}$=256 gray levels can be expressed. Further, in the case of a source driver which processes m-bit digital data, $2^{m}$ gray levels can be expressed.

However, in order to improve the performance of a source driver, the circuit structure of the source driver is complicated and a layout area is increased.

Thus, in this embodiment, a structure for expressing multiple gray levels without complication of a source driver is described.

In this embodiment, n-bit digital data of input m-bit digital data is used for voltage gradation and (m−n)-bit digital data is used for time gradation. In this manner, m-bit gray levels can be expressed in a source driver in which voltage gradation for n bits is employed. Therefore, multiple gray levels can be expressed without complication of the source driver. Note that m and n are positive integers, where m>n.

A structure in which voltage gradation and time gradation are combined with each other is described below. Here, the case is described in which 4-bit (m=4) digital data is input, 2-bit digital data (n=2) is used for voltage gradation, and 2-bit digital data (m−n=2) is used for time gradation. Note that m and n are not limited to certain numbers.

First, the structure of a display device of this embodiment is described with reference to FIG. 2. The display device includes the display portion 100 and a data processing circuit 200.

The display portion 100 is similar to that illustrated in FIG. 1; thus, description thereof is omitted.

In the data processing circuit 200, 2-bit digital data used for voltage gradation is generated using 2-bit digital data of 4-bit input digital data. In addition, 2-bit data of the 4-bit input digital data is used for time gradation. Further, a signal (for example, digital data) in which the voltage gray level and the time gray level are combined with each other is output to the source driver.

Here, a method for expressing gray levels in the display device of this embodiment is described with reference to FIG. 3. Input digital data has four bits and data related to 16 gray levels. A voltage level $V_L$ is the lowest voltage level that is input to the source driver. A voltage level $V_H$ is the highest voltage level that is input to the source driver.

In this embodiment, 2-bit digital data is used for voltage gradation; thus, three voltage levels are set between the voltage level $V_H$ and the voltage level $V_L$ so that differences between adjacent voltage levels are substantially equal to one another, so that voltage levels for four gray levels are expressed. The difference between adjacent voltage levels is denoted by $\alpha$, and $\alpha=(V_H-V_L)/4$ is obtained.

Thus, when the digital data is (00), a voltage level output from the source driver is $V_L$. When the digital data is (01), the voltage level output from the source driver is $V_L+\alpha$. When the digital data is (10), the voltage level output from the source driver is $V_L+2\alpha$. When the digital data is (11), the voltage level output from the source driver is $V_L+3\alpha$.

In this manner, the source driver can output four voltage levels: $V_L$, $V_L+\alpha$, $V_L+2\alpha$, and $V_L+3\alpha$. That is, when n-bit digital data of m-bit digital data is used for voltage gradation, the source driver can output $2^n$ voltagelevels.

Then, in this embodiment, in order to increase gray levels which can be expressed in the display device, a method in which voltage gradation and time gradation are used in combination is employed. A time gradation method in this embodiment is described below.

First, in the display device of this embodiment, a so-called line-at-a-time driving method by which pixels for one line are concurrently driven is employed. That is, analog gray level voltages are concurrently written to the pixels for one line. The cycle in whichanalog gray level voltages are written to all the pixels in a pixel portion is referred to as one frame period.

One frame period is divided into a plurality of periods (referred to as subframe periods). Line-at-a-time driving is performed in each subframe period so that analog gray level voltages are written to all the pixels. The average value of the analog gray level voltages written in each subframe period is calculated, and gray levels are expressed using the average voltage level. In this embodiment, one frame period is divided into four subframe periods (first to fourth subframe periods).

That is, when 2-bit digital data is used for the time gradation, the difference a between the voltage levels is divided into approximately fourequal pieces by using the 2-bit digital data, so that gray levels can be increased. Accordingly, when (m−n)-bit digital data of m-bit digital data is used for time gradation, one frame period is divided into $2^{(m-n)}$ subframe periods.

Figure 3:
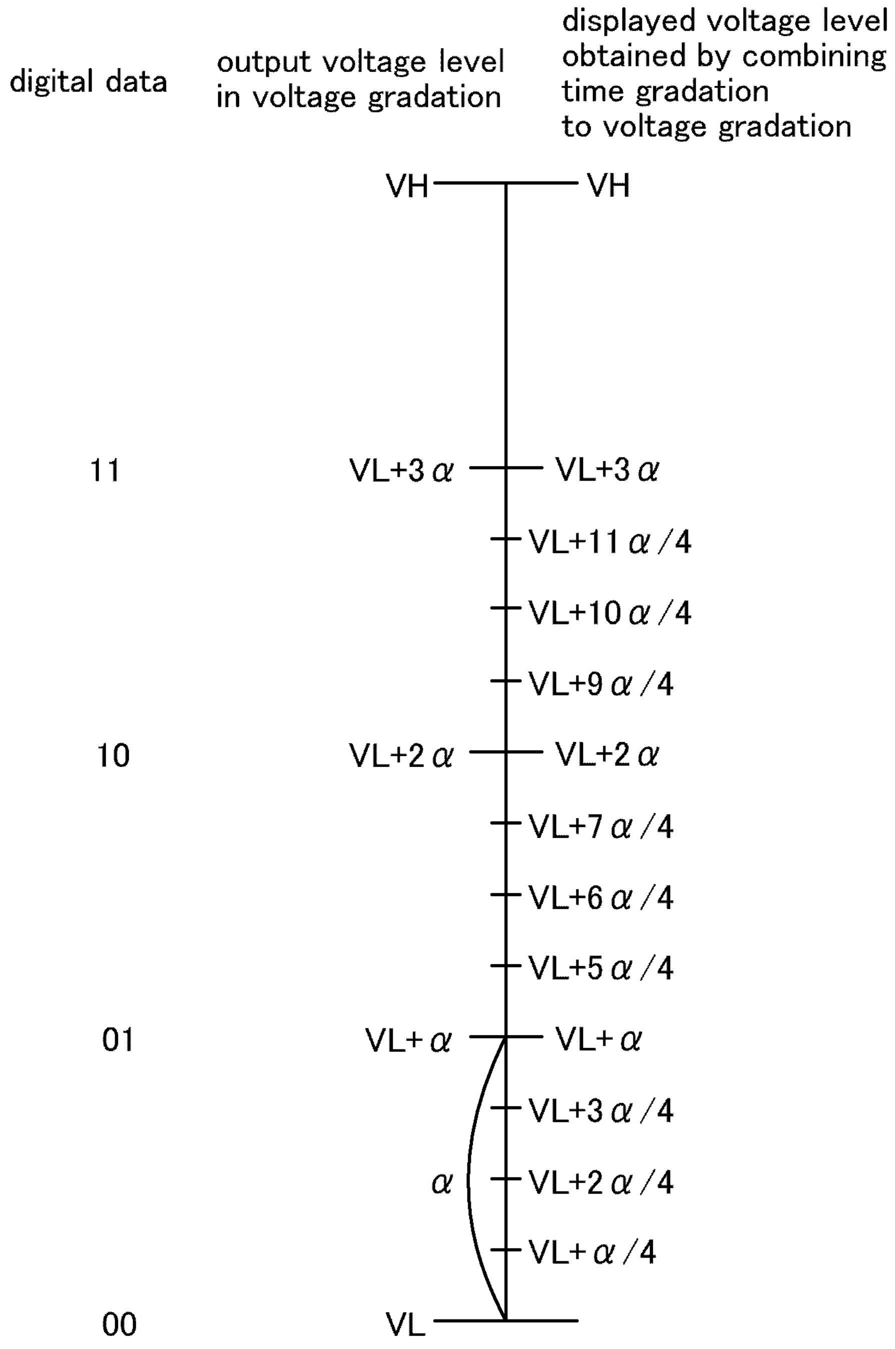
FIG. 3 illustrates gray level voltage.

With a combination of the voltage gradation and the time gradation, display corresponding to voltage levels $V_L$, $V_L+\alpha/4$, $V_L+2\alpha/4$, $V_L+3\alpha/4$, $V_L+\alpha$, $V_L+5\alpha/4$, $V_L+6\alpha/4$, $V_L+7\alpha/4$, $V_L+2\alpha$, $V_L+9\alpha/4$, $V_L+10\alpha/4$, $V_L+11\alpha/4$, and $V_L+3\alpha$ can be realized (see FIG. 3).

An example of a method in which data is processed with a combination of voltage gradation and time gradation is described below.

Figure 2:
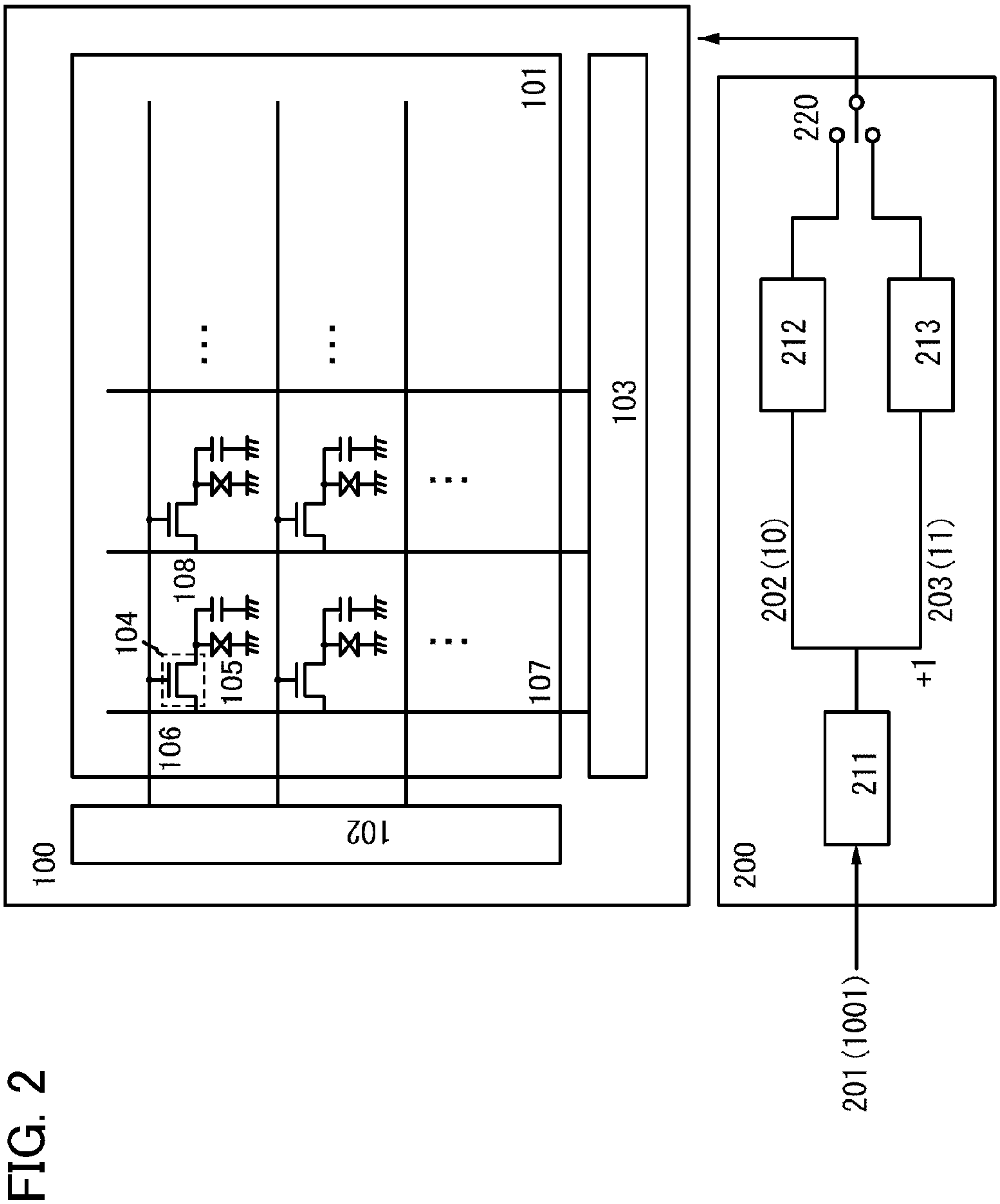
FIG. 2 illustrates an example of a display device.

In FIG. 2, digital data 201 is input to the data processing circuit 200. In this embodiment, the 4-bit digital data 201 is (1001). The input digital data 201 is written to a memory 211.

Then, the digital data 201 is read from the memory 211; the digital data (10) of higher-order two bits are written to a memory 212 as digital data 202; and the digital data (11) obtained by adding "1" to a first bit of the higher-order two bits are written to a memory 213 as digital data 203.

Then, one frame period is divided into four periods, and digital data in four subframe periods (a first subframe period 231, a second subframe period 232, a third subframe period 233, and a fourth subframe period 234) is determined from lower-order two bits. When the digital data of the lower-order two bits is (01), the digital data 202 is read from the memory 212 three times, the digital data 203 is read from the memory 213 once, and the digital data 202 and the digital data 203 are output to the source driver 103 in the display portion 100 through a switch 220. The digital data 202 and the digital data 203 are read from the memory 212 and the memory 213 four times in total.

Here, the frequency of reading of the digital data 203 is determined by the values of the lower-order two bits. In other words, when the digital data of the lower-order two bits is (00), the digital data 203 is not read. When the digital data of the lower-order two bits is (01), the digital data 203 is read once. When the digital data of the lower-order two bits is (10), the digital data 203 is read twice. When the digital data of the lower-order two bits is (11), the digital data 203 is read three times. In this example, the digital data of the lower-order two bits is (01), so that the digital data 203 is read once and the digital data 202 is read three times.

For example, the digital data 202 is output in the first subframe period 231, the second subframe period 232, and the third subframe period 233, and the digital data 203 is output in the fourth subframe period 234. In that case, the digital data in the first to fourth subframe periods is sequentially (10), (10), (10), and (11). The digital data is input to the source driver (see FIG. 4). Note that the order of the digital data is not limited to the above example.

Figure 5:
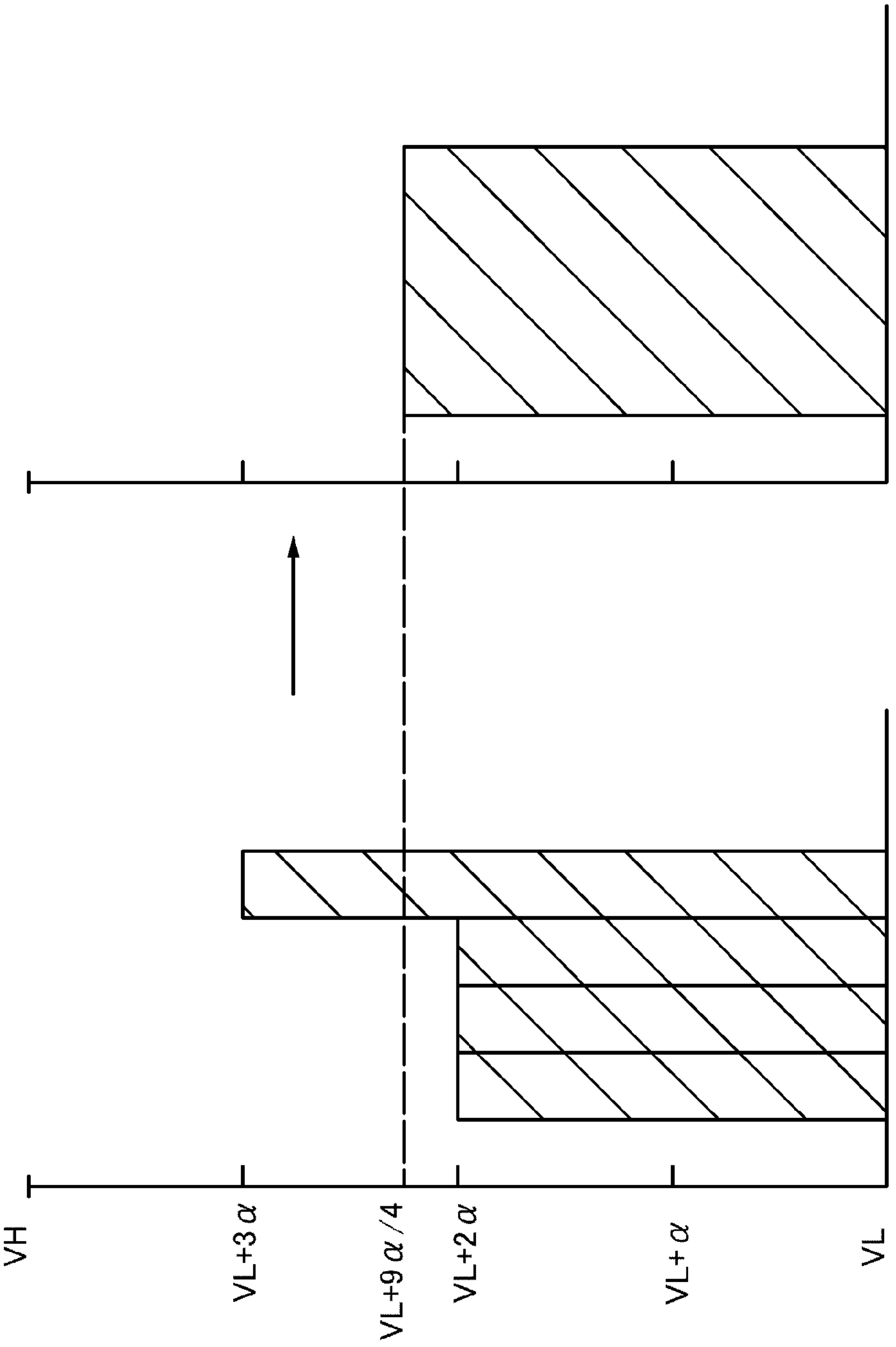
FIG. 5 illustrates an example of data processing.

In the first to fourth subframe periods, analog gray level voltages $V_L+2\alpha$, $V_L+2\alpha$, $V_L+2\alpha$, and $V_L+3\alpha$ which correspond to the digital data (10), (10), (10), and (11) are input from the source driver to predetermined pixels. In the pixels, gray levels are expressed as a voltage level of $V_L+9\alpha/4$ which is an average value 240 of the analog gray level voltages (see FIG. 4 and FIG. 5).

Further, gray levels can be expressed by similar processing also in the case where the digital data 201 of any one of (0000) to (1111) is input (see FIG. 4).

Note that when the digital data of the higher-order bits in the input digital data 201 are all "1" (e.g., (11)), $V_H$ may be input to pixels in subframe periods, as illustrated in FIG. 13. When $V_H$ is used, gray levels can be further increased. Therefore, when n-bit digital data of m-bit digital data is used for voltage gradation, the source driver can output up to $(2^n+1)$ voltage levels (that is, $(2^n+1)$ or less voltage levels).

In this manner, with a combination of voltage gradation and time gradation, gray levels corresponding to four bits can be expressed in a source driver which processes two bits. That is, multiple gray levels can be expressed without complication of the source driver. Thus, a digital processing circuit described in this embodiment is configured; to select two voltage levels, which is to be output from a source driver, among $(2^n+1)$ voltage levels based on n-bit digital data of input m-bit digital data; and to output $2^{m-n}$ digital data for one pixel in one frame period to the source driver where each of the $2^{m-n}$ digital data is selected from either of two digital data corresponding to the two voltage levels.

However, even if multiple gray levels are to be expressed by data processing of this embodiment, it is difficult to express desired gray levels when the gray level characteristics of a pixel are poor because of the high off-state current of a transistor. In that case, the gray level characteristics are improved when the pixel includes the transistor including an oxide semiconductor described in Embodiment 1; thus, gray levels can be expressed at voltage levels generated by data processing.

Further, if the time taken to write data to a pixel becomes longer in data processing of this embodiment, operation speed is decreased in some cases. When one frame period is divided into four periods as described in this embodiment, it is necessary to quadruple the writing time. In such a case, the transistor including an oxide semiconductor has a mobility of 10 $cm^2$/Vs or higher; thus, the writing time can be shortened.

That is, a combination of Embodiment 1 and this embodiment is extremely effective, and multiple gray levels can be expressed and high-speed operation can be realized.

This embodiment can be combined with any of the other embodiments as appropriate.

EMBODIMENT 3

In this embodiment, examples of the structure of a semiconductor device and a manufacturing method thereof are described.

Figure 6A:
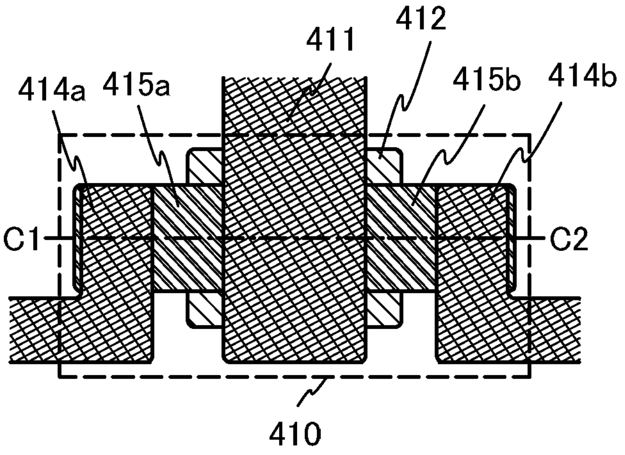
FIGS. 6A and 6B illustrate examples of a structure of a transistor and a manufacturing method thereof.
Figure 6B:
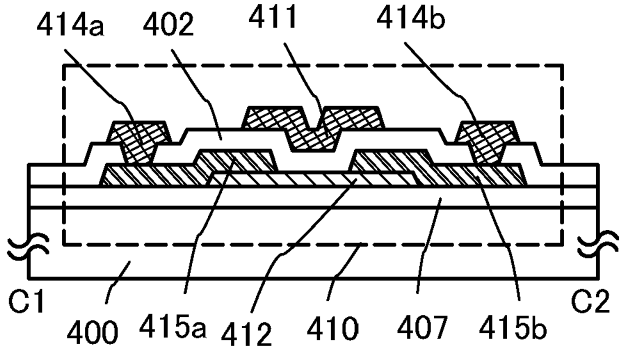

FIG. 6A illustrates an example of the plane structure of a semiconductor device. In addition, FIG. 6B is an example of the cross-sectional structure of the semiconductor device and illustrates a cross-section in line C1-C2 in FIG. 6A. The semiconductor device includes a transistor 410.

The transistor 410 is a top-gate thin film transistor. The transistor 410 includes an oxide semiconductor layer 412, a first electrode (one of a source electrode and a drain electrode) 415*a*, a second electrode (the other of the source electrode and the drain electrode) 415*b*, a gate insulating layer 402, and a gate electrode 411.

Note that although the transistor 410 is described as a single-gate transistor, the transistor 410 may be a multi-gate transistor.

Next, steps of forming the transistor 410 are described with reference to FIGS. 7A to 7E.

First, an insulating layer 407 serving as a base film is formed over a substrate 400.

It is necessary that the substrate 400 have at least heat resistance high enough to withstand heat treatment to be performed later. In the case where the temperature of the heat treatment to be performed later is high, a substrate whose strain point is 730° C. or higher is preferably used.

Specific examples of the substrate 400 include a glass substrate, a crystalline glass substrate, a ceramic substrate, a quartz substrate, a sapphire substrate, a plastic substrate, and the like. Further, specific examples of the material of a glass substrate include aluminosilicate glass, aluminoborosilicate glass, and barium borosilicate glass.

The insulating layer 407 can be formed to have a single-layer structure or a layered structure including an oxide insulating layer such as a silicon oxide layer, a silicon oxynitride layer, an aluminum oxide layer, or an aluminum oxynitride layer.

The insulating layer 407 can be formed by plasma-enhanced CVD, sputtering, or the like. In particular, when the insulating layer 407 is formed by sputtering, hydrogen, water, a hydroxyl group, or hydroxide (such substances are referred to as "hydrogen or the like") contained in the insulating layer 407 can be reduced.

In this embodiment, a silicon oxide layer is deposited as the insulating layer 407 by sputtering. As a sputtering gas, oxygen, a mixed gas of oxygen and argon, or the like can be used. In addition, it is preferable that hydrogen or the like be removed from the sputtering gas and that the sputtering gas contain high-purity oxygen. Further, silicon or quartz (preferably synthesized quartz) can be used as a target. Note that the substrate 400 may be at room temperature or may be heated during deposition.

For example, the insulating layer 407 is deposited under the following condition: quartz is used as the target; the temperature of the substrate is 108° C.; the distance between the substrate and the target (the T-S distance) is 60 mm; the pressure is 0.4 Pa; the high-frequency power is 1.5 kW; a mixed gas of oxygen and argon (an oxygen flow rate of 25 sccm: an argon flow rate of 25 sccm=1:1) is used as the sputtering gas. Note that the thickness of the insulating layer 407 is 100 nm.

As the sputtering gas, a high-purity gas from which hydrogen or the like is removed to about a concentration of ppm or ppb is preferably used.

It is preferable that hydrogen or the like be not contained in the insulating layer 407 by removal of moisture remaining in a deposition chamber.

In order to remove moisture remaining in the deposition chamber, an adsorption vacuum pump may be used. For example, a cryopump, an ion pump, or a titanium sublimation pump can be used. In particular, a cryopump effectively exhausts hydrogen or the like from the deposition chamber. Therefore, hydrogen or the like contained in the insulating layer 407 can be reduced as much as possible. Further, as an exhaustion means, a turbo pump is preferably used in combination with a cold trap.

Examples of sputtering include RF sputtering in which a high-frequency power source is used as a sputtering power source, DC sputtering in which a DC power source is used, and pulsed DC sputtering in which a bias is applied in a pulsed manner. RF sputtering is mainly used in the case where an insulating film is deposited, and DC sputtering is mainly used in the case where a metal film is deposited.

Alternatively, a multi-target sputtering apparatus may be used. In a multi-target sputtering apparatus, a plurality of targets including different materials can be set, and a plurality of targets can be concurrently or separately sputtered in one deposition chamber. For example, when a plurality of targets are concurrently sputtered, a film including a plurality of materials can be formed. Alternatively, when the plurality of targets are separately sputtered, a plurality of films including different materials can be formed.

Alternatively, a sputtering apparatus used for magnetron sputtering may be used. The sputtering apparatus is provided with a magnet system inside a deposition chamber. Alternatively, a sputtering apparatus used for ECR sputtering may be used. In the sputtering apparatus, plasma generated with the use of microwaves is used.

Further, as a deposition method, reactive sputtering may be used. The reactive sputtering is a method by which a target and a sputtering gas are chemically reacted with each other during deposition to form a compound thin film thereof. Alternatively, bias sputtering may be used. The bias sputtering is a method by which voltage is also applied to a substrate during deposition.

Further, the insulating layer 407 may have a single-layer structure or a layered structure including a nitride insulating layer such as a silicon nitride layer, silicon nitride oxide layer, an aluminum nitride layer, or an aluminum nitride oxide layer. Alternatively, the insulating layer 407 may have a structure in which the nitride insulating layer and the oxide insulating layer are stacked.

A stack of the nitride insulating layer and the oxide insulating layer is formed by the following method, for example. First, a silicon nitride layer is deposited in such a manner that a sputtering gas containing high-purity nitrogen is introduced in a deposition chamber and a silicon target is used. Then, a silicon oxide layer is deposited in such a manner that the sputtering gas is changed to a sputtering gas containing high-purity oxygen. Note that as described above, it is preferable to deposit the silicon nitride layer and the silicon oxide layer while moisture remaining in the deposition chamber is removed. Further, the substrate may be heated during deposition.

Then, an oxide semiconductor layer is formed over the insulating layer 407 by sputtering.

It is preferable that the oxide semiconductor layer contain hydrogen or the like as little as possible. Thus, it is preferable that hydrogen or the like that is adsorbed on the substrate 400 be eliminated and exhausted by preheating of the substrate 400 over which the insulating layer 407 is formed as pretreatment for deposition. Note that the preheating may be performed in a preheating chamber of a sputtering apparatus. As an exhaustion means provided in the preheating chamber, a cryopump is preferable. Note that the preheating may be omitted.

Further, as the pretreatment of deposition, dust on a surface of the insulating layer 407 is preferably removed by introduction of an argon gas and generation of plasma. This process is referred to as reverse sputtering. The reverse sputtering is a method in which, without application of voltage to a target side, a high-frequency power source is used for application of voltage to a substrate side in an argon atmosphere and plasma is generated so that the surface of the insulating layer 407 is modified. Note that nitrogen, helium, oxygen, or the like may be used instead of argon.

As the target of the oxide semiconductor layer, a metal oxide target containing zinc oxide as a main component can be used. For example, a target having a composition ratio of $In_2O_3$:$Ga_2O_3$:ZnO=1:1:1 [mol %], i.e., In:Ga:Zn=1:1:0.5 [at. %] can be used. Alternatively, a target having a composition ratio of In:Ga:Zn=1:1:1 [at. %] or In:Ga:Zn=1:1:2 [at. %] can be used. Alternatively, a target containing $SiO_2$ at 2 to 10 wt % can be used. The filling rate of metal oxide in the target is 90 to 100%, preferably 95 to 99.9%. With the use of the target having a high filling rate, the deposited oxide semiconductor layer 412 can have high density.

Note that the oxide semiconductor layer may be deposited in a rare gas (typically argon) atmosphere, an oxygen atmosphere, or a mixed atmosphere of a rare gas and oxygen. Here, as a sputtering gas used for deposition of the oxide semiconductor layer, a high-purity gas from which hydrogen or the like is removed to about a concentration of ppm or ppb is preferably used.

It is preferable that hydrogen or the like be not contained in the oxide semiconductor layer by removal of moisture remaining in the deposition chamber. When hydrogen or the like contained in the deposition chamber is exhausted using a cryopump as described above, hydrogen or the like contained in the oxide semiconductor layer can be reduced as much as possible. Further, the substrate may be at room temperature or may be heated at a temperature lower than 400° C. during deposition. Note that the deposition chamber is preferably kept under reduced pressure.

For example, the oxide semiconductor layer is deposited under the following condition: a target having a composition ratio of $In_2O_3$:$Ga_2O_3$:ZnO=1:1:1 [mol %]; the temperature of the substrate is at room temperature; the T-S distance is 110 mm; the pressure is 0.4 Pa; DC (direct current) power is 0.5 kW; a mixed gas of oxygen and argon (an oxygen flow rate of 15 sccm: an argon flow rate of 30 sccm) is used as the sputtering gas. Note that with the use of pulsed DC (direct current) power, generation of dust can be suppressed and thickness distribution can be made uniform, which are advantageous. The thickness of the oxide semiconductor layer is 2 to 200 nm (preferably 5 to 30 nm). Note that since the appropriate thickness of the oxide semiconductor layer varies depending on the material of the oxide semiconductor used, the thickness may be determined as appropriate depending on the material.

In the above example, a compound layer containing indium, gallium, zinc, and oxygen (these substances are also referred to as In—Ga—Zn—O) is used as the oxide semiconductor layer; however, In—Sn—Ga—Zn—O, In—Sn—Zn—O, In—Al—Zn—O, Sn—Ga—Zn—O, Al—Ga—Zn—O, Sn—Al—Zn—O, In—Zn—O, Sn—Zn—O, Al—Zn—O, Zn—Mg—O, Sn—Mg—O, In—Mg—O, In—O, Sn—O, Zn—O, or the like can be used. The oxide semiconductor layer may contain Si. Further, the oxide semiconductor layer may be amorphous or crystalline. Alternatively, the oxide semiconductor layer may be non-single-crystal or single crystal.

As the oxide semiconductor layer, a compound layer expressed by $InMO_3(ZnO)_m$ (m>0) can be used. Here, M denotes one or more metal elements selected from Ga, Al, Mn, or Co. For example, M can be Ga, Ga and Al, Ga and Mn, or Ga and Co.

Figure 7A:
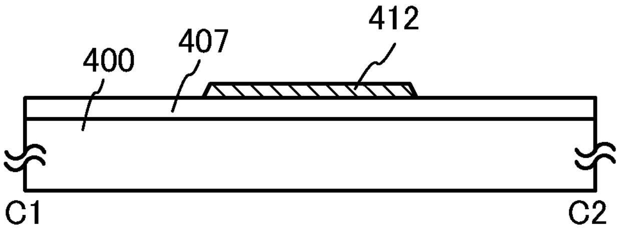
FIGS. 7A to 7E illustrate examples of a structure of a transistor and a manufacturing method thereof.
Figure 7B:
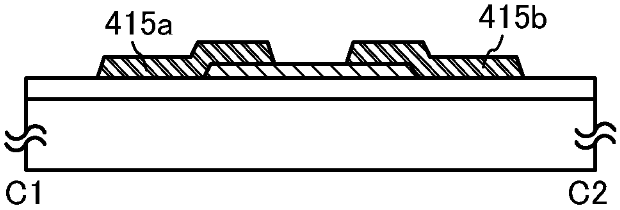

Then, the oxide semiconductor layer is processed into the island-shaped oxide semiconductor layer 412 by etching through a first photolithography process (see FIG. 7A). Note that a resist used for the processing may be formed by an inkjet method. When the resist is formed by an inkjet method, a photomask is not used; thus, manufacturing cost can be reduced.

Further, the resist may be formed using a multi-tone photomask. A multi-tone photomask is a mask capable of exposure with multi-level amount of light (light intensity). With the use of the multi-tone photomask, the number of photomasks can be reduced.

Note that as the etching of the oxide semiconductor layer, dry etching, wet etching, or both dry etching and wet etching may be employed.

In the case of dry etching, parallel plate RIE (reactive ion etching) or ICP (inductively coupled plasma) etching can be used. In order to etch the layer to have a desired shape, the etching conditions (the amount of electric power applied to a coiled electrode, the amount of electric power applied to an electrode on a substrate side, the temperature of the electrode on the substrate side, and the like) are adjusted as appropriate.

As an etching gas used for dry etching, a gas containing chlorine (a chlorine-based gas such as chlorine, boron chloride, silicon chloride, or carbon tetrachloride) is preferable; however, a gas containing fluorine (a fluorine-based gas such as carbon tetrafluoride, sulfur fluoride, nitrogen fluoride, or trifluoromethane), hydrogen bromide, oxygen, any of these gases to which a rare gas such as helium or argon is added, or the like can be used.

As an etchant used for wet etching, a mixed solution of phosphoric acid, acetic acid, and nitric acid, an ammonia hydrogen peroxide mixture (hydrogen peroxide at 31 wt %: ammonia at 28 wt %: water=5:2:2), or the like can be used. Alternatively, ITO-07N (manufactured by KANTO CHEMICAL CO., INC.) may be used. The etching conditions (e.g., an etchant, etching time, and temperature) may be adjusted as appropriate depending on the material of the oxide semiconductor.

In the case of wet etching, the etchant is removed together with the etched material by cleaning. Waste liquid of the etchant including the removed material may be purified and the material contained in the waste liquid may be reused.

When a material (e.g., a rare metal such as indium) contained in the oxide semiconductor layer is collected from the waste liquid after the etching and reused, the resources can be efficiently used.

In this embodiment, the oxide semiconductor layer is processed into the island-shaped oxide semiconductor layer 412 by wet etching with the use of a mixed solution of phosphoric acid, acetic acid, and nitric acid as an etchant.

Then, the oxide semiconductor layer 412 is subjected to first heat treatment. The temperature of the first heat treatment is 400 to 750° C., preferably higher than or equal to 400° C. and lower than the strain point of the substrate. Here, after the substrate is put in an electric furnace which is a kind of heat treatment apparatus, the oxide semiconductor layer is subjected to heat treatment at 450° C. for one hour in a nitrogen atmosphere. Through the first heat treatment, hydrogen or the like can be removed from the oxide semiconductor layer 412.

Note that the heat treatment apparatus is not limited to the electric furnace, and a device with which heat treatment is performed by thermal conduction or thermal radiation from a heater (e.g., a resistance heater) may be used. For example, an RTA (rapid thermal annealing) apparatus such as a GRTA (gas rapid thermal annealing) apparatus or an LRTA (lamp rapid thermal annealing) apparatus can be used.

An LRTA apparatus is an apparatus with which heat treatment is performed by radiation of light (an electromagnetic wave) emitted from a lamp such as a halogen lamp, a metal halide lamp, a xenon arc lamp, a carbon arc lamp, a high pressure sodium lamp, or a high pressure mercury lamp.

A GRTA apparatus is an apparatus with which heat treatment is performed using a high-temperature gas. An inert gas (typically a rare gas such as argon) or a nitrogen gas can be used as the gas.

For example, in the case where the first heat treatment is performed using a GRTA apparatus, the substrate may be heated for several minutes in a high-temperature (e.g., 650 to 700° C.) inert gas and then may be taken out of the inert gas. The GRTA apparatus enables high-temperature heat treatment in a short time.

In the first heat treatment, it is preferable that hydrogen or the like be not contained in the atmosphere. Alternatively, the purity of a gas such as nitrogen, helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

Note that depending on the condition of the first heat treatment or the material of the oxide semiconductor layer 412, the island-shaped oxide semiconductor layer 412 might be crystallized by the first heat treatment and the crystal structure of the island-shaped oxide semiconductor layer 412 might be a microcrystalline structure or a polycrystalline structure.

For example, the oxide semiconductor layer 412 might be a microcrystalline oxide semiconductor layer having a degree of crystallinity of 80% or more. Note that even when the first heat treatment is performed, the island-shaped oxide semiconductor layer 412 might be an amorphous oxide semiconductor layer without crystallization. The oxide semiconductor layer 412 might be an oxide semiconductor layer in which a microcrystalline portion (with a grain diameter of 1 to 20 nm, typically 2 to 4 nm) exists in an amorphous oxide semiconductor layer.

In addition, the first treatment may be performed on the oxide semiconductor layer before being processed into an island-shaped oxide semiconductor layer. In that case, the first photolithography process is performed after the first heat treatment, so that the oxide semiconductor layer is processed into an island-shaped oxide semiconductor layer.

Note that the first heat treatment may be performed in a later step. For example, the first heat treatment may be performed after a source electrode and a drain electrode are formed over the oxide semiconductor layer 412 or after a gate insulating layer is formed over the source electrode and the drain electrode.

Although the first heat treatment is performed mainly for the purpose of removing hydrogen or the like from the oxide semiconductor layer 412, oxygen defects might be generated in the oxide semiconductor layer 412 in the first heat treatment. Therefore, excessive oxidation treatment is preferably performed after the first heat treatment. Specifically, heat treatment in an oxygen atmosphere or an atmosphere containing nitrogen and oxygen (for example, nitrogen to oxygen is 4 to 1 in volume ratio) is performed as the excessive oxidation treatment performed after the first heat treatment, for example. Alternatively, plasma treatment in an oxygen atmosphere can be employed.

As described above, through the first heat treatment, hydrogen or the like can be removed from the oxide semiconductor layer. That is, through the first heat treatment, the oxide semiconductor layer is dehydrated or dehydrogenated.

Then, a conductive film is formed over the insulating layer 407 and the oxide semiconductor layer 412.

The conductive film may be formed by sputtering or vacuum evaporation. As the material of the conductive film, a metal material such as Al, Cu, Cr, Ta, Ti, Mo, W, or Y; an alloy material including the metal material; a conductive metal oxide; or the like can be used. For example, in order to prevent generation of hillocks or whiskers, an Al material to which an element such as Si, Ti, Ta, W, Mo, Cr, Nd, Sc, or Y is added may be used. In that case, heat resistance can be increased. As a conductive metal oxide, indium oxide, tin oxide, zinc oxide, an alloy containing indium oxide and tin oxide (ITO), an alloy containing indium oxide and zinc oxide (IZO), or the metal oxide material containing silicon or silicon oxide can be used.

Further, the conductive film may have a single-layer structure or a layered structure of two or more layers. For example, a single-layer structure of an aluminum film including silicon, a two-layer structure in which a titanium film is stacked over an aluminum film, or a three-layer structure in which a titanium film, an aluminum film, and a titanium film are stacked in that order can be used. Alternatively, a structure in which a metal layer of Al, Cu, or the like and a refractory metal layer of Cr, Ta, Ti, Mo, W, or the like are stacked may be used.

In this embodiment, as the conductive film, a 150-nm-thick titanium film is formed by sputtering.

Then, a resist is formed over the conductive film in a second photolithography process; the first electrode **415*a* and the second electrode 415*b* are formed by selective etching; then, the resist is removed (see FIG. 7**B).

The first electrode **415*a* functions as one of the source electrode and the drain electrode. The second electrode 415*b* functions as the other electrode. Here, end portions of the first electrode 415*a* and the second electrode 415*b*** are preferably etched so as to be tapered because coverage with the gate insulating layer stacked thereover is improved.

Note that the resist used for forming the first electrode **415*a* and the second electrode 415*b*** may be formed by an inkjet method. When the resist is formed by an inkjet method, a photomask is not used; thus, manufacturing cost can be reduced. A multi-tone photomask may be used.

It is necessary that the oxide semiconductor layer 412 be not removed when the conductive film is etched.

For example, In—Ga—Zn—O is used for the oxide semiconductor layer 412, titanium is used for the conductive film, and an ammonia hydrogen peroxide mixture (a mixture of ammonia, water, and a hydrogen peroxide solution) is used as an etchant. Thus, with a difference in etching rate, removal of the oxide semiconductor layer 412 can be prevented.

Note that by adjustment of etching conditions, part of the oxide semiconductor layer 412 is etched so that an oxide semiconductor layer having a groove (a depression) can be formed. For example, a channel etched thin film transistor can be provided.

Further, KrF laser light, ArF laser light, or the like may be used for exposure at the time of formation of the resist. With the use of an ultraviolet ray (having a wavelength of several nanometers to several tens of nanometers), the resolution of the exposure and the depth of focus can be increased; thus, microfabrication can be performed.

Here, as illustrated in FIG. 6B, the channel length of the transistor 410 is determined depending on a distance between the two electrodes (the first electrode 415*a* and the second electrode 415*b*). Thus, in the case where the channel length is made short (for example, greater than or equal to 10 nm and less than 1000 nm), the two electrodes are preferably formed by exposure with the ultraviolet ray. When the channel length is made short, the transistor can operate at higher speed, off-state current can be lowered, or power consumption can be reduced.

Note that after the first electrode 415*a* and the second electrode 415*b* are formed, water or the like absorbed onto an exposed surface of the oxide semiconductor layer 412 may be eliminated by plasma treatment with a gas such as nitrogen monoxide, nitrogen, or argon. Alternatively, plasma treatment may be performed using a mixed gas of oxygen and argon.

Figure 7C:
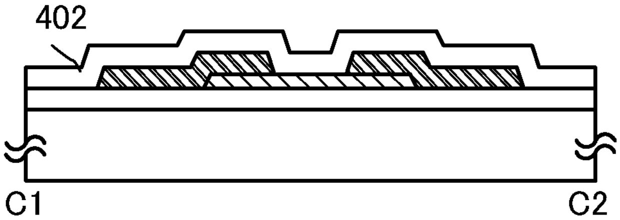

Then, the gate insulating layer 402 is formed over the insulating layer 407, the oxide semiconductor layer 412, the first electrode 415*a*, and the second electrode 415*b* (see FIG. 7C).

The gate insulating layer 402 can be formed to have a single-layer structure or a layered structure including a silicon oxide layer, a silicon nitride layer, a silicon oxynitride layer, a silicon nitride oxide layer, or an aluminum oxide layer by plasma-enhanced CVD, sputtering, or the like.

The gate insulating layer 402 is preferably formed in such a manner that hydrogen or the like is not contained in the gate insulating layer 402. Thus, the gate insulating layer 402 may be formed by the above sputtering. In this embodiment mode, a 100-nm-thick silicon oxide layer is formed. Note that before the gate insulating layer 402 is formed, the above preheating is preferably performed.

For example, the gate insulating layer 402 is deposited under the following condition: quartz is used as a target; the pressure is0.4 Pa; high-frequency power is 1.5 kW; a mixed gas of oxygen and argon (an oxygen flow rate of 25 sccm: an argon flow rate of 25 sccm=1:1) is used as a sputtering gas.

Figure 7D:
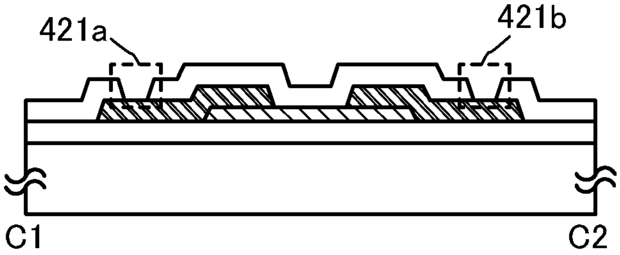

Next, a resist is formed in a third photolithography process and part of the gate insulating layer 402 is removed by selective etching, so that openings 421*a* and 421*b* which reach the first electrode 415*a* and the second electrode 415*b* are formed (see FIG. 7D). Note that when the resist is formed by an inkjet method, a photomask is not used; thus, manufacturing cost can be reduced.

Then, a conductive film is formed over the gate insulating layer 402 and the openings 421*a* and 421*b*, and then the gate electrode 411, a first wiring layer 414*a*, and a second wiring layer 414*b* are formed through a fourth photolithography process.

The gate electrode 411, the first wiring layer 414*a*, and the second wiring layer 414*b* can be formed to have a single-layer structure or a layered structure including a metal material such as Mo, Ti, Cr, Ta, W, Al, Cu, Nd, or Sc, or an alloy material containing the metal material as a main component.

Specific examples of a two-layer structure of the gate electrode 411, the first wiring layer 414*a*, and the second wiring layer 414*b* include a structure in which a molybdenum layer is stacked over an aluminum layer, a structure in which a molybdenum layer is stacked over a copper layer, a structure in which a titanium nitride layer or a tantalum nitride layer is stacked over a copper layer, and a structure in which a molybdenum layer is stacked over a titanium nitride layer.

As a specific example of a three-layer structure, there is a structure in which a tungsten layer (or a tungsten nitride layer), an alloy layer of aluminum and silicon (or an alloy layer of aluminum and titanium), and a titanium nitride layer (or a titanium layer) are stacked. Note that the gate electrode can be formed using a light-transmitting conductive film. As a specific example of a light-transmitting conductive film, there is a light-transmitting conductive oxide.

In this embodiment, as the gate electrode 411, the first wiring layer 414*a*, and the second wiring layer 414*b*, a 150-nm-thick titanium film formed by sputtering is used.

Next, second heat treatment (preferably at 200 to 400° C., for example, 250 to 350° C.) is performed in an inert gas atmosphere or an oxygen gas atmosphere. In this embodiment, the second heat treatment is performed at 250° C. for one hour in a nitrogen atmosphere. Through the second heat treatment, hydrogen or the like contained in the oxide semiconductor layer 412 is further reduced, so that the oxide semiconductor layer 412 is highly purified.

Further, after the second heat treatment, heat treatment may be performed at 100 to 200° C. for 1 to 30 hours in an air atmosphere. This heat treatment may be performed at a fixed heating temperature. Alternatively, the following change in the heating temperature may be conducted plural times repeatedly: the heating temperature is increased from room temperature to a temperature of 100 to 200° C. and then decreased to room temperature.

Figure 7E:
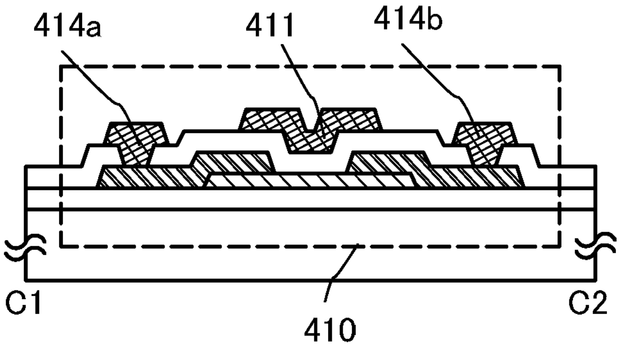

Through the above steps, the transistor 410 can be formed (see FIG. 7E). The transistor 410 can be used as the transistor described in Embodiment 1.

Note that a protective insulating layer or a planarization insulating layer for planarization may be provided over the transistor 410. In addition, the second heat treatment may be performed after the step of forming the protective insulating layer or the planarization insulating layer.

The protective insulating layer can be formed to have a single-layer structure or a layered structure including a silicon oxide layer, a silicon nitride layer, a silicon oxynitride layer, a silicon nitride oxide layer, or an aluminum oxide layer.

The planarization insulating layer can include a heat-resistant organic material such as polyimide, acrylic, benzocyclobutene, polyamide, or epoxy. Other than such organic materials, it is possible to use a low-dielectric constant material (a low-k material), a siloxane-based resin, PSG (phosphosilicate glass), BPSG (borophosphosilicate glass), or the like. Alternatively, the planarization insulating layer may be formed by stacking a plurality of insulating films including these materials.

Here, a siloxane-based resin corresponds to a resin including a Si—O—Si bond that includes a siloxane-based material as a starting material. The siloxane-based resin may include an organic group (e.g., an alkyl group or an aryl group) as a substituent. Further, the organic group may include a fluoro group.

There is no particular limitation on the method for forming the planarization insulating layer. The planarization insulating layer can be formed, depending on the material, by a method such as sputtering, an SOG method, a spin coating method, a dipping method, a spray coating method, or a droplet discharge method (e.g., an inkjet method, screen printing, or offset printing), or a tool such as a doctor knife, a roll coater, a curtain coater, or a knife coater.

As described above, a semiconductor device including an intrinsic or substantially intrinsic oxide semiconductor can be manufactured.

This embodiment can be combined with any of the other embodiments as appropriate.

EMBODIMENT 4

In this embodiment, examples of the structure of a semiconductor device and a manufacturing method thereof are described.

Figure 8A:
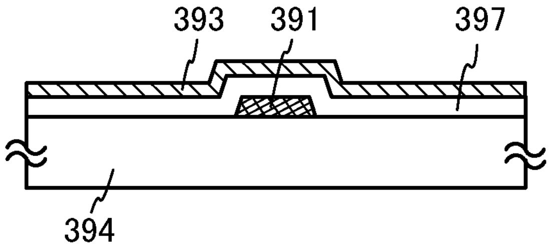
FIGS. 8A to 8E illustrate examples of a structure of a transistor and a manufacturing method thereof.
Figure 8B:
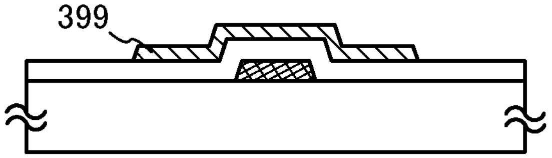
Figure 8C:
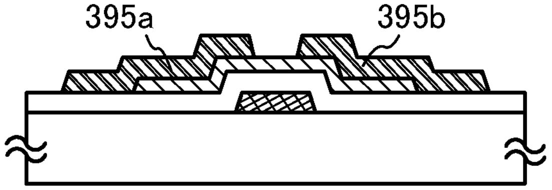
Figure 8D:
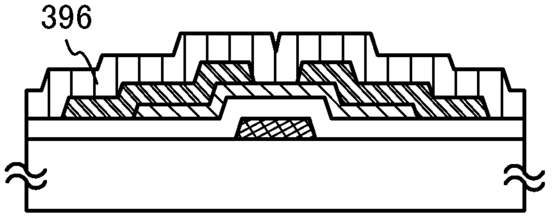
Figure 8E:
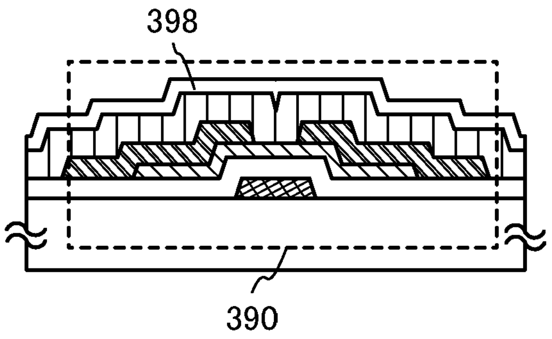

FIG. 8E illustrates an example of the cross-sectional structure of the semiconductor device. The semiconductor device includes a transistor 390.

The transistor 390 is a bottom-gate transistor. The transistor 390 includes a gate electrode 391, a gate insulating layer 397, an oxide semiconductor layer 399, a first electrode 395*a*, and a second electrode 395*b*.

The transistor 390 can be used as the transistor described in Embodiment 1, for example. Note that a multi-gate transistor may be used.

A method for forming the transistor 390 over a substrate 394 is described below with reference to FIGS. 8A to 8E.

First, the gate electrode 391 is formed over the substrate 394. The material and the like of the substrate 394 are similar to those in Embodiment 3. Further, the material, deposition method, and the like of the gate electrode 391 are similar to those in Embodiment 3.

Note that an insulating film serving as a base film (e.g., a silicon oxide film or a silicon nitride film) may be provided between the substrate 394 and the gate electrode 391.

Then, the gate insulating layer 397 is formed over the gate electrode 391. The material, deposition method, and the like of the gate insulating layer 397 are similar to those of the gate insulating layer 402 described in Embodiment 3.

Then, the oxide semiconductor layer 393 is formed over the gate insulating layer 397 (see FIG. 8A). After that, an island-shaped oxide semiconductor layer 399 is formed through photolithography (see FIG. 8B). Note that the material, deposition method, and the like of the oxide semiconductor layer 399 are similar to those of the oxide semiconductor layer 412 described in Embodiment 3.

Here, as in Embodiment 3, first heat treatment is preferably performed on the oxide semiconductor layer 399.

Then, the first electrode 395*a* and the second electrode 395*b* are formed over the gate insulating layer 397 and the oxide semiconductor layer 399 (see FIG. 8C). The material, deposition method, and the like of the first electrode 395*a* and the second electrode 395*b* are similar to those of the first electrode 415*a* and the second electrode 415*b* described in Embodiment 3.

Through the above steps, the transistor 390 can be formed. The transistor 390 can be used as the transistor described in Embodiment 1.

Note that a protective insulating layer 396 which is in contact with the oxide semiconductor layer 399, the first electrode 395*a*, and the second electrode 395*b* may be formed (see FIG. 8D).

The protective insulating layer 396 can be formed to have a single-layer structure or a layered structure including an oxide insulating layer such as a silicon oxide layer, a silicon nitride layer, a silicon oxynitride layer, a silicon nitride oxide layer, or an aluminum oxide layer. As the protective insulating layer 396, the substrate 394 over which layers up to the oxide semiconductor layer 399, the first electrode 395*a*, and the second electrode 395*b* are formed is kept at room temperature or heated to a temperature lower than 100° C., a sputtering gas including high-purity oxygen from which hydrogen and moisture are removed is introduced, and a silicon semiconductor target, whereby a silicon oxide layer is formed.

Next, second heat treatment may be performed. The second heat treatment may be performed at 200 to 400° C. (preferably 250 to 350° C.) in an inert gas (e.g., nitrogen) atmosphere or an oxygen atmosphere. In this embodiment, the second heat treatment is performed at 250° C. for one hour in a nitrogen atmosphere.

Through the second heat treatment, hydrogen or the like contained in the oxide semiconductor layer 399 can be diffused into the protective insulating layer 396 so as to be further reduced.

Further, an insulating layer 398 may be provided over the protective insulating layer 396. The insulating layer 398 can be formed to have a single-layer structure or a layered structure including a silicon nitride film, a silicon nitride oxide film, an aluminum nitride film, an aluminum nitride oxide film, or the like.

Note that it is preferable that hydrogen or the like be not contained in the oxide semiconductor layer 399 when the protective insulating layer 396 and the insulating layer 398 are deposited. Therefore, as described in Embodiment 3, when hydrogen or the like contained in a deposition chamber is exhausted using a cryopump, hydrogen or the like contained in oxide semiconductor layer 399 can be reduced as much as possible.

As described above, a semiconductor device including an intrinsic or substantially intrinsic oxide semiconductor can be manufactured.

This embodiment can be combined with any of the other embodiments as appropriate.

EMBODIMENT 5

In this embodiment, examples of the structure of a semiconductor device and a manufacturing method thereof are described.

Figure 9A:
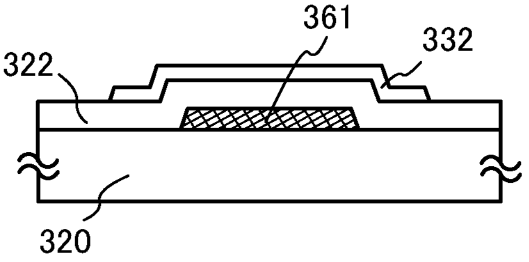
FIGS. 9A to 9D illustrate examples of a structure of a transistor and a manufacturing method thereof.
Figure 9B:
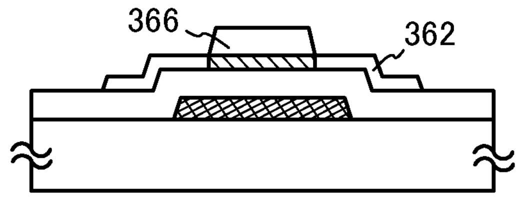
Figure 9C:
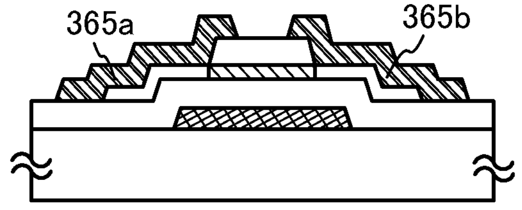
Figure 9D:
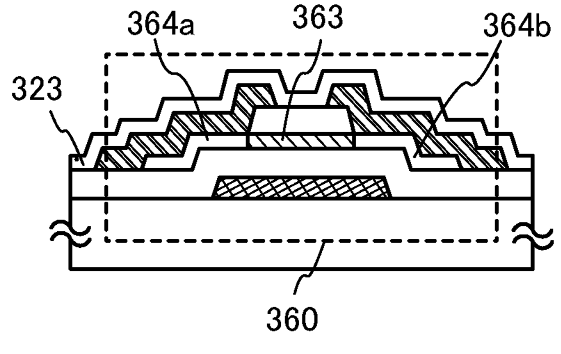

FIG. 9D illustrates an example of the cross-sectional structure of the semiconductor device. The semiconductor device includes a transistor 360.

The transistor 360 is a bottom-gate transistor. The transistor 360 includes a gate electrode 361, a gate insulating layer 322, an oxide semiconductor layer 362, an oxide insulating layer 366, a first electrode 365*a*, and a second electrode 365*b*.

This embodiment differs from Embodiment 4 in that the oxide insulating layer 366 is formed over a channel formation region 363 in the oxide semiconductor layer 362. Such a transistor is referred to as a channel-protective transistor (also referred to as a channel-stop transistor).

A method for forming the transistor 360 over a substrate 320 is described below with reference to FIGS. 9A to 9D. Steps up to a step of forming the oxide semiconductor layer 332 (see FIG. 9A) are similar to the steps in Embodiment 4.

Note that as in Embodiment 4, it is preferable to perform first heat treatment so that hydrogen or the like contained in the oxide semiconductor layer 332 is reduced.

Then, the oxide insulating layer 366 is formed over the oxide semiconductor layer 332 (see FIG. 9B).

The oxide insulating layer 366 can be formed to have a single-layer structure or a layered structure including a silicon oxide layer, a silicon oxynitride layer, an aluminum oxide layer, an aluminum oxynitride layer, or the like. In this embodiment, a 200-nm-thick silicon oxide layer is deposited by sputtering.

For example, the oxide insulating layer 366 may be deposited under the following condition: silicon is used as a target; the temperature of the substrate is at higher than or equal to room temperature and lower than or equal to 300° C.; a mixed gas of oxygen and nitrogen is used as a sputtering gas. Note that silicon oxide may be used as the target. Further, a rare gas (typically argon), oxygen, or a mixed gas of a rare gas and oxygen may be used as the sputtering gas.

In this case, it is preferable that hydrogen or the like be not contained in the oxide semiconductor layer 332. As described in Embodiment 3, a cryopump or the like may be used.

Next, second heat treatment is performed. The second heat treatment may be performed at 200 to 400° C. (preferably 250 to 350° C.) in an inert gas (e.g., nitrogen) atmosphere or an oxygen atmosphere. In this embodiment, the second heat treatment is performed at 250° C. for one hour in a nitrogen atmosphere.

Through the second heat treatment, a region of the oxide semiconductor layer 332 that is covered with the oxide insulating layer 366 has higher resistance because oxygen is supplied from the oxide insulating layer 366.

In contrast, regions of the oxide semiconductor layer 332 that are not covered with the oxide insulating layer 366 can have lower resistance because oxygen deficiency is generated through the second heat treatment. Therefore, the regions of the oxide semiconductor layer 332 that are not covered with the oxide insulating layer 366 can have lower resistance in a self-aligning manner.

In other words, the oxide semiconductor layer 362 subjected to the second heat treatment have regions having different resistances (in FIG. 9B, a shaded region and white regions).

Then, the first electrode 365*a* and the second electrode 365*b* are formed (see FIG. 9C). Note that the material and the deposition method of the first electrode 365*a* and the second electrode 365*b* are similar to those of the first electrode 395*a* and the second electrode 395*b* described in Embodiment 4.

Through the above steps, the transistor 360 is formed. The transistor 360 can be used as the transistor described in Embodiment 1.

Note that a protective insulating layer 323 may be formed over the transistor 360 (see FIG. 9D). The material and the deposition method of the protective insulating layer 323 are similar to those of the protective insulating layer described in Embodiment 4.

In this embodiment, after hydrogen or the like contained in the oxide semiconductor layer 332 is reduced by the first heat treatment, part of the oxide semiconductor layer 362 is selectively made to be in an oxygen excess state by the second heat treatment.

Accordingly, in the oxide semiconductor layer 362, the channel formation region 363 which overlaps with the gate electrode 361 becomes intrinsic or substantially intrinsic. Further, a region 364*a* which overlaps with the first electrode 365*a* and a region 364*b* which overlaps with the second electrode 365*b* have low resistance.

As described above, a semiconductor device including an intrinsic or substantially intrinsic oxide semiconductor can be manufactured.

This embodiment can be combined with any of the other embodiments as appropriate.

EMBODIMENT 6

In this embodiment, examples of the structure of a semiconductor device and a manufacturing method thereof are described.

Figure 10A:
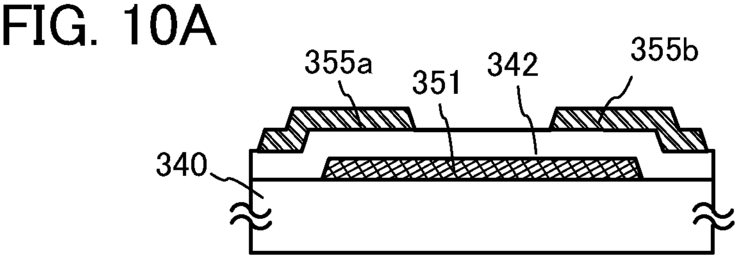
FIGS. 10A to 10D illustrate examples of a structure of a transistor and a manufacturing method thereof.
Figure 10B:
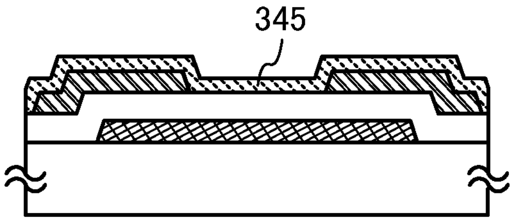
Figure 10C:
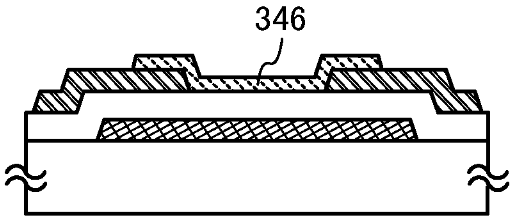
Figure 10D:
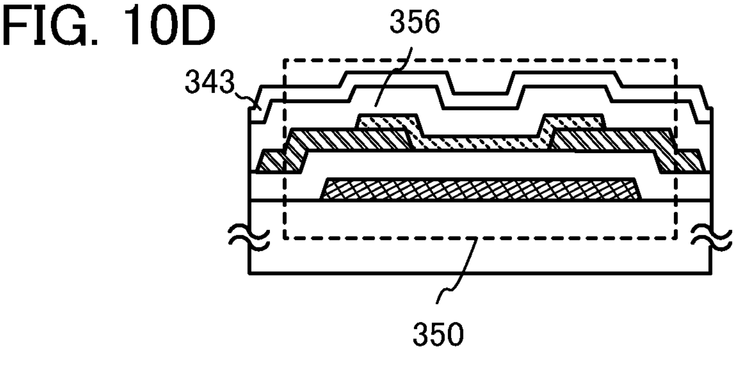

FIG. 10D illustrates an example of the cross-sectional structure of the semiconductor device. The semiconductor device includes a transistor 350.

The transistor 350 is a bottom-gate transistor. The transistor 350 includes a gate electrode 351, a gate insulating layer 342, a first electrode 355*a*, a second electrode 355*b*, and an oxide semiconductor layer 346.

This embodiment differs from Embodiment 4 (FIGS. 8A to 8E) in that the first electrode 355*a* and the second electrode 355*b* are provided between the gate insulating layer 342 and the oxide semiconductor layer 346.

Steps of forming the transistor 350 over a substrate 340 are described below with reference to FIGS. 10A to 10D. Steps up to a step of forming the gate insulating layer 342 are similar to the steps in Embodiment 4.

Then, the first electrode 355*a* and the second electrode 355*b* are formed over the gate insulating layer 342 (see FIG. 10A). The material, deposition method, and the like of the first electrode 355*a* and the second electrode 355*b* are similar to those of the first electrode 395*a* and the second electrode 395*b* described in Embodiment 4.

Then, an oxide semiconductor film 345 is formed (see FIG. 10B). After that, the island-shaped oxide semiconductor layer 346 is obtained by etching (see FIG. 10C). The material, deposition method, and the like of the oxide semiconductor layer 346 are similar to those of the oxide semiconductor layer 399 described in Embodiment 4. Note that as in Embodiment 4, it is preferable to perform first heat treatment so that hydrogen or the like contained in the oxide semiconductor layer 346 is reduced.

Through the above steps, the transistor 350 can be formed. The transistor 350 can be used as the transistor described in Embodiment 1.

Note that an oxide insulating layer 356 which is in contact with the oxide semiconductor layer 346 may be formed (see FIG. 10D). The material, deposition method, and the like of the oxide insulating layer 356 are similar to those of the oxide insulating layer 396 described in Embodiment 4.

Next, second heat treatment may be performed. The second heat treatment may be performed at 200 to 400° C. (preferably 250 to 350° C.) in an inert gas (e.g., nitrogen) atmosphere or an oxygen atmosphere. In this embodiment, the second heat treatment is performed at 250° C. for one hour in a nitrogen atmosphere.

Through the second heat treatment, oxygen is supplied to the oxide semiconductor layer 346 from the oxide insulating layer 356, so that the oxide semiconductor layer 346 can be made to be in an oxygen excess state. Accordingly, the oxide semiconductor layer 346 becomes intrinsic or substantially intrinsic.

Note that an insulating layer 343 may be provided over the oxide insulating layer 356 (see FIG. 10D). As the material, deposition method, and the like of the insulating layer 343, a material, a deposition method, and the like which are similar to those of the insulating layer 398 described in the above embodiment can be employed.

As described above, a semiconductor device including an intrinsic or substantially intrinsic oxide semiconductor can be manufactured.

This embodiment can be combined with any of the other embodiments as appropriate.

EMBODIMENT 7

In this embodiment, specific examples of electronic devices including the display device described in the above embodiment are described. Note that electronic devices applicable to the present invention are not limited to the following specific examples.

Figure 11A:
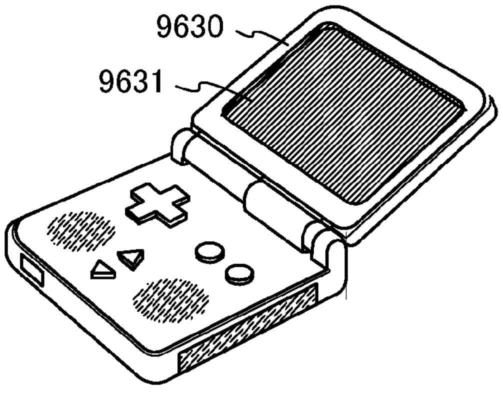
FIGS. 11A to 11C illustrate examples of electronic devices.
Figure 11B:
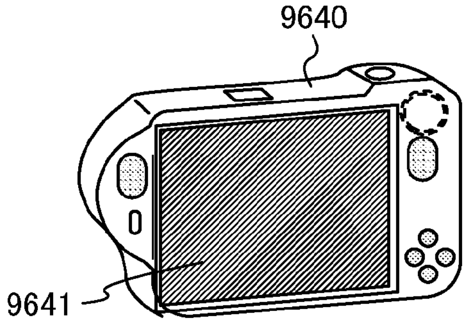
Figure 11C:
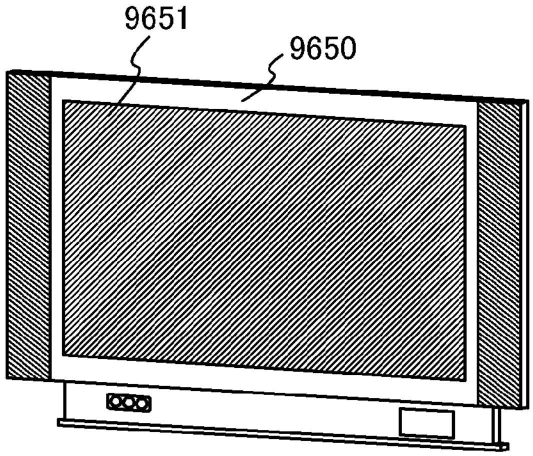
Figure 12A:
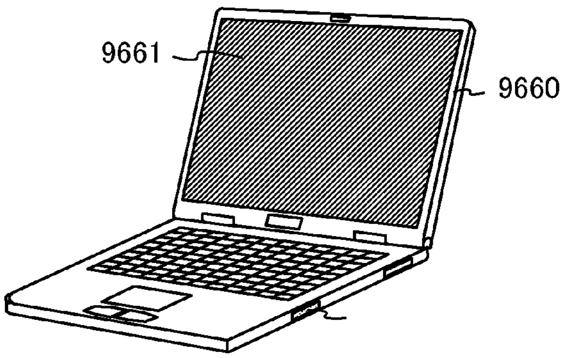
FIGS. 12A to 12D illustrate examples of electronic devices.
Figure 12B:
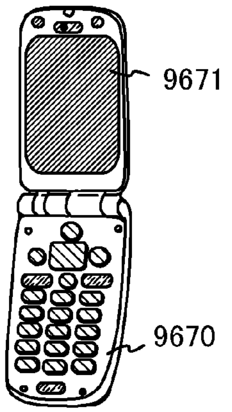
Figure 12C:
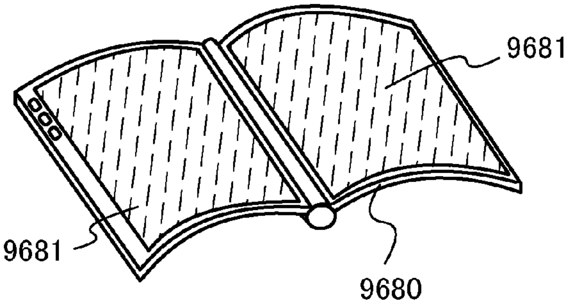
Figure 12D:
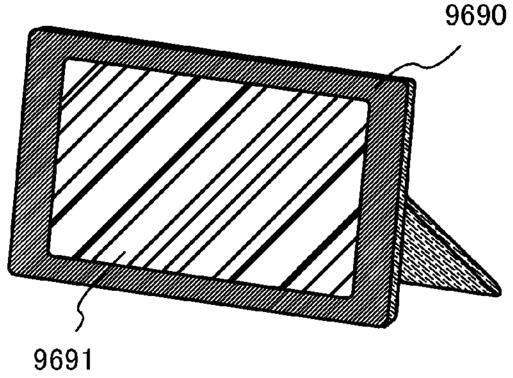

FIG. 11A illustrates a portable game machine. FIG. 11B illustrates a digital camera. FIG. 11C illustrates a television receiver. FIG. 12A illustrates a computer. FIG. 12B illustrates a cellular phone. FIG. 12C illustrates electronic paper. The electronic paper can be used for an e-book reader (also referred to as electronic book or an e-book), a poster, or the like. FIG. 12D illustrates a digital photo frame. A display device which is one embodiment of the present invention can be used for display portions 9631, 9641, 9651, 9661, 9671, 9681, and 9691 provided in housings 9630, 9640, 9650, 9660, 9670, 9680, and 9690.

When the display device which is one embodiment of the present invention is used in these electronic devices, reliability can be improved and power consumed at the time of display of still images can be reduced.

This embodiment can be combined with any of the other embodiments as appropriate.

This application is based on Japanese Patent Application serial no. 2009-292630 filed with Japan Patent Office on Dec. 24, 2009, the entire contents of which are hereby incorporated by reference.

REFERENCE NUMERALS

100: display portion, 101: pixel portion, 102: gate driver, 103: source driver, 104: transistor, 105: liquid crystal element, 106: wiring, 107: wiring, 108: capacitor, 200: data processing circuit, 201: digital data, 202: digital data, 203: digital data, 211: memory, 212: memory, 213: memory, 220: switch, 231: subframe period, 232: subframe period, 233: subframe period, 234: subframe period, 240: average value, 320: substrate, 322: gate insulating layer, 323: protective insulating layer, 332: oxide semiconductor layer, 340: substrate, 342: gate insulating layer, 343: insulating layer, 345: oxide semiconductor layer, 346: oxide semiconductor layer, 350: transistor, 351: gate electrode, **355*a*: electrode, 355*b*: electrode, 356: oxide insulating layer, 360: transistor, 361: gate electrode, 362: oxide semiconductor layer, 363: channel formation region, 364*a*: region, 364*b*: region, 365*a*: electrode, 365*b*: electrode, 366: oxide insulating layer, 390: transistor, 391: gate electrode, 393: oxide semiconductor layer, 394: substrate, 395*a*: electrode, 395*b*: electrode, 396: protective insulating layer, 397: gate insulating layer, 398: insulating layer, 399: oxide semiconductor layer, 400: substrate, 402: gate insulating layer, 407: insulating layer, 410: transistor, 411: gate electrode, 412: oxide semiconductor layer, 415*a*: electrode, 415*b*: electrode, 414*a*: wiring layer, 414*b*: wiring layer, 421*a*: opening, 421*b*: opening, 5000: pixel, 5001: transistor, 5002: liquid crystal element, 5003: capacitor, 9630: housing, 9640: housing, 9650: housing, 9660: housing, 9670: housing, 9680: housing, 9690: housing, 9631: display portion, 9641: display portion, 9651: display portion, 9661: display portion, 9671: display portion, 9681: display portion, and 9691**: display portion.

The invention claimed is:

1. A display device comprising:

a pixel portion comprising pixels arranged in matrix wherein each of the pixels includes a transistor and a display element;

a gate driver electrically connected to a gate of the transistor;

a source driver electrically connected to one of a source and a drain of the transistor; and a data processing circuit configured to output signals to the source driver, wherein the transistor has a channel formation region including an oxide semiconductor, wherein the data processing circuit is configured to output the signals by using n-bit digital data of input m-bit digital data for voltage gradation and by using (m−n) bit digital data for time gradation, wherein m and n are positive integers, where m>n, and wherein an off-state current per unit channel width of the transistor is 10 aA/.mu.m or less.

2. The display device according to claim 1, wherein one frame period is divided into $2^{m-n}$ subframe periods for the time gradation.

3. The display device according to claim 1, wherein the source driver outputs ($2^n$+1) or less voltage levels.

4. The display device according to claim 1, wherein the transistor has a mobility of 10 $cm^2$/Vs or higher.

5. The display device according to claim 1, wherein the transistor is formed over a substrate.

6. The display device according to claim 1, wherein the display element is a liquid crystal element.

7. An electronic device including the display device according to claim 1, wherein the electronic device is one selected from the group consisting of a portable game machine, a digital camera, a television receiver, a computer, an electronic paper, and a digital photo frame.

8. A display device comprising: a pixel portion comprising pixels arranged in matrix wherein each of the pixels includes a transistor and a display element;

a gate driver electrically connected to a gate of the transistor;

a source driver electrically connected to one of a source and a drain of the transistor; and a data processing circuit configured to output signals to the source driver, wherein the transistor has a channel formation region including an intrinsic or substantially intrinsic oxide semiconductor, wherein the data processing circuit is configured to output the signals by using n-bit digital data of input m-bit digital data for voltage gradation and by using (m−n) bit digital data for time gradation, wherein m and n are positive integers, where m>n, and wherein an off-state current per unit channel width of the transistor is 10 aA/.mu.m or less.

9. The display device according to claim 8, wherein carrier concentration of the intrinsic or the substantially intrinsic oxide semiconductor is lower than $1\times10^{14}/cm^3$.

10. The display device according to claim 8, wherein one frame period is divided into $2^{m-n}$ subframe periods for the time gradation.

11. The display device according to claim 8, wherein the source driver outputs ($2^n$+1) or less voltage levels.

12. The display device according to claim 8, wherein the transistor has a mobility of 10 $cm^2$/Vs or higher.

13. The display device according to claim 8, wherein the transistor is formed over a substrate.

14. The display device according to claim 8, wherein the display element is a liquid crystal element.

15. An electronic device including the display device according to claim 8, wherein the electronic device is one selected from the group consisting of a portable game machine, a digital camera, a television receiver, a computer, an electronic paper, and a digital photo frame.

16. A display device comprising: a pixel portion comprising pixels arranged in matrix wherein each of the pixels includes a transistor and a display element;

a gate driver electrically connected to a gate of the transistor;

a source driver electrically connected to one of a source and a drain of the transistor; and a data processing circuit configured to output signals to the source driver, wherein the transistor has a channel formation region including an oxide semiconductor and has an off-state current of 1 aA/.mu.m or less, wherein in the data processing circuit is configured to process n-bit digital data of input m-bit digital data as data related to voltage gradation and to process (m−n) bit digital data as data related to time gradation, wherein m and n are positive integers, where m>n, wherein the signals are output to the source driver through a switch in the data processing circuit, and wherein an off-state current per unit channel width of the transistor is 10 aA/.mu.m or less.

17. The display device according to claim 16, wherein carrier concentration of the oxide semiconductor is lower than $1\times10^{14}/cm^3$.

18. The display device according to claim 16, wherein one frame period is divided into $2^{m-n}$ subframe periods for the time gradation.

19. The display device according to claim 16, wherein the source driver outputs $(2^n+1)$ or less voltage levels.

20. The display device according to claim 16, wherein the transistor has a mobility of 10 $cm^2/Vs$ or higher.

21. The display device according to claim 16, wherein the display element is a liquid crystal element.

22. An electronic device including the display device according to claim 16, wherein the electronic device is one selected from the group consisting of a portable game machine, a digital camera, a television receiver, a computer, an electronic paper, and a digital photo frame.

23. A display device comprising: a pixel portion comprising pixels arranged in matrix wherein each of the pixels includes a transistor and a display element;

a gate driver electrically connected to a gate of the transistor;

a source driver electrically connected to one of a source and a drain of the transistor; and a data processing circuit, wherein the transistor has a channel formation region including an oxide semiconductor, wherein the data processing circuit is configured to select two voltage levels, which is to be output from the source driver, among (n−1) voltage levels based on n-bit digital data of input m-bit digital data, wherein the data processing circuit is configured to output 2.sup.m-n digital data for one pixel in one frame period to the source driver where each of the 2.sup.m-n digital data is selected from either of two digital data corresponding to the two voltage levels, and wherein m and n are positive integers, where m>n, and wherein an off-state current per unit channel width of the transistor is 10 aA/.mu.m or less.

24. The display device according to claim 23, wherein the one frame period is divided into $2^{m-n}$ subframe periods.

25. The display device according to claim 23, wherein the source driver outputs $(2^n+1)$ or less voltage levels.

26. The display device according to claim 23, wherein the transistor has a mobility of 10 $cm^2/Vs$ or higher.

27. The display device according to claim 23, wherein the transistor is formed over a substrate.

28. The display device according to claim 23, wherein the display element is a liquid crystal element.

29. An electronic device including the display device according to claim 23, wherein the electronic device is one selected from the group consisting of a portable game machine, a digital camera, a television receiver, a computer, an electronic paper, and a digital photo frame.

30. The display device according to claim 1, wherein the oxide semiconductor includes indium, gallium, zinc, and oxygen.

31. The display device according to claim 8, wherein the intrinsic or substantially intrinsic oxide semiconductor includes indium, gallium, zinc, and oxygen.

32. The display device according to claim 16, wherein the oxide semiconductor includes indium, gallium, zinc, and oxygen.

33. The display device according to claim 23, wherein the oxide semiconductor includes indium, gallium, zinc, and oxygen.

* * * * *

UNITED STATES PATENT AND TRADEMARK OFFICE
CERTIFICATE OF CORRECTION

PATENT NO. : 9,047,836 B2
APPLICATION NO. : 12/972737
DATED : June 2, 2015
INVENTOR(S) : Jun Koyama It is certified that error appears in the above-identified patent and that said Letters Patent is hereby corrected as shown below:

Specification

At column 5, line 18, “p” should be --$\rho$--;

At column 5, line 19, “p= RAIL” should be --$\rho = RA/L$--;

At column 7, line 26, “voltagelevels.” should be --voltage levels.--;

At column 7, line 47, “a” should be --$\alpha$--;

At column 15, line 53, “is0.4;” should be --is 0.4--;

Claims

In claim 16, at column 23, lines 19-20, delete “and has an off state current of 1 aA/.mu.m or less”.

Signed and Sealed this
Fifteenth Day of December, 2015

Michelle K. Lee
*Director of the United States Patent and Trademark Office*